US009718250B2

(12) United States Patent
Nealey et al.

(10) Patent No.: US 9,718,250 B2
(45) Date of Patent: Aug. 1, 2017

(54) DIRECTED ASSEMBLY OF BLOCK COPOLYMER FILMS BETWEEN A CHEMICALLY PATTERNED SURFACE AND A SECOND SURFACE

(75) Inventors: Paul Franklin Nealey, Madison, WI (US); Huiman Kang, Madison, WI (US); Guoliang Liu, Madison, WI (US); Hiroshi Yoshida, Mito (JP); Yashuhiko Tada, Hitachinaka (JP); Juan Jose De Pablo, Madison, WI (US); Abelardo Ramirez-Hernandez, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 529 days.

(21) Appl. No.: 13/619,525

(22) Filed: Sep. 14, 2012

(65) Prior Publication Data
US 2013/0189504 A1 Jul. 25, 2013

Related U.S. Application Data

(60) Provisional application No. 61/535,210, filed on Sep. 15, 2011.

(51) Int. Cl.
*B32B 3/10* (2006.01)
*B32B 37/14* (2006.01)
(Continued)

(52) U.S. Cl.
CPC .............. *B32B 3/10* (2013.01); *B32B 37/14* (2013.01); *B81C 1/00031* (2013.01);
(Continued)

(58) Field of Classification Search
CPC .............................. B81C 2201/0149
See application file for complete search history.

(56) References Cited

U.S. PATENT DOCUMENTS 3,444,732 A 5/1969 McKinley et al.
4,235,657 A 11/1980 Greenman et al.
(Continued)

FOREIGN PATENT DOCUMENTS

JP 10-330494 12/1998
JP 2004-087531 3/2004
(Continued)

OTHER PUBLICATIONS

"Monte Carlo simulation of triblock copolymer thin films," Feng et al., Polymer, 2002, 43, p. 5775-5790.*
(Continued)

*Primary Examiner* — Ian Rummel
(74) *Attorney, Agent, or Firm* — Weaver Austin Villeneuve & Sampson LLP

(57) ABSTRACT

Provided are methods of fabricating thin film structures that involve assembling block copolymer materials in the presence of condensed phase surfaces on both sides of the thin film, at least one of which is a chemically patterned surface configured to direct the assembly of the block copolymer material. According to various embodiments, the other of the condensed phase surfaces can be a chemically homogenous surface or a chemically patterned surface. Also provided are structures, morphologies, and templates formed in the domain structure of block copolymer materials. In certain embodiments, complex 3-D morphologies and related structures not present in bulk block copolymer materials are provided.

19 Claims, 16 Drawing Sheets

(51) Int. Cl.
  *B82Y 30/00* (2011.01)
  *B81C 1/00* (2006.01)
  *H01L 21/033* (2006.01)
(52) U.S. Cl.
  CPC .......... *B82Y 30/00* (2013.01); *H01L 21/0337* (2013.01); *B81C 2201/0149* (2013.01); *Y10T 428/24851* (2015.01)

(56) References Cited

U.S. PATENT DOCUMENTS

| | | |
|---|---|---|
| 5,948,470 A | 9/1999 | Harrison et al. |
| 6,146,755 A | 11/2000 | Guha et al. |
| 6,162,532 A | 12/2000 | Black et al. |
| 6,565,763 B1 | 5/2003 | Asakawa et al. |
| 6,746,825 B2 | 6/2004 | Nealey et al. |
| 6,893,705 B2 | 5/2005 | Thomas |
| 6,926,953 B2 | 8/2005 | Nealey et al. |
| 7,704,432 B2 | 4/2010 | Dumond et al. |
| 7,763,319 B2 | 7/2010 | Cheng et al. |
| 7,901,607 B2 | 3/2011 | Xu et al. |
| 7,959,975 B2 | 6/2011 | Millward |
| 8,133,341 B2 | 3/2012 | Nealey et al. |
| 8,133,534 B2 | 3/2012 | Nealey et al. |
| 8,168,284 B2 | 5/2012 | Nealey et al. |
| 8,287,957 B2 | 10/2012 | Nealey et al. |
| 8,501,304 B2 | 8/2013 | Stoykovich et al. |
| 8,618,221 B2 | 12/2013 | Nealey et al. |
| 8,623,493 B2 | 1/2014 | Nealey et al. |
| 9,183,870 B2 | 11/2015 | Nealey et al. |
| 9,299,381 B2 | 3/2016 | Nealey et al. |
| 9,372,398 B2 | 6/2016 | Nealey et al. |
| 2002/0132083 A1 | 9/2002 | Weller et al. |
| 2003/0091752 A1* | 5/2003 | Nealey et al. ............... 427/558 |
| 2003/0091865 A1 | 5/2003 | Chen et al. |
| 2004/0091748 A1 | 5/2004 | Kamata et al. |
| 2004/0143063 A1 | 7/2004 | Chen et al. |
| 2004/0174257 A1 | 9/2004 | Kuhns et al. |
| 2006/0134556 A1 | 6/2006 | Nealey et al. |
| 2007/0092721 A1 | 4/2007 | Kishimoto |
| 2007/0095469 A1 | 5/2007 | Burdinski |
| 2008/0075978 A1 | 3/2008 | Weller et al. |
| 2008/0233435 A1 | 9/2008 | Hasegawa et al. |
| 2008/0257187 A1 | 10/2008 | Millward |
| 2008/0299353 A1 | 12/2008 | Stoykovich et al. |
| 2009/0087653 A1 | 4/2009 | Nealey et al. |
| 2009/0087664 A1 | 4/2009 | Nealey et al. |
| 2009/0196488 A1 | 8/2009 | Nealey et al. |
| 2009/0260750 A1 | 10/2009 | Nealey et al. |
| 2009/0274887 A1 | 11/2009 | Millward et al. |
| 2010/0255268 A1 | 10/2010 | Choi et al. |
| 2010/0316849 A1 | 12/2010 | Millward et al. |
| 2011/0104452 A1 | 5/2011 | Grozea et al. |
| 2011/0186544 A1 | 8/2011 | Endou et al. |
| 2012/0164392 A1 | 6/2012 | Stoykovich et al. |
| 2012/0189824 A1 | 7/2012 | Nealey et al. |
| 2012/0202017 A1 | 8/2012 | Nealey et al. |
| 2013/0189504 A1 | 7/2013 | Nealey et al. |
| 2013/0230705 A1 | 9/2013 | Nealey et al. |
| 2014/0010990 A1 | 1/2014 | Nealey et al. |
| 2014/0065379 A1 | 3/2014 | Nealey et al. |
| 2014/0087142 A1 | 3/2014 | Nealey et al. |
| 2016/0133292 A1 | 5/2016 | Nealey et al. |

FOREIGN PATENT DOCUMENTS

| | | |
|---|---|---|
| JP | 2004/099667 | 4/2004 |
| JP | 2005-502916 | 1/2005 |
| JP | 2005-502917 | 1/2005 |
| JP | 2006/334693 | 12/2006 |
| JP | 2007/138052 | 6/2007 |
| JP | 2007/111215 | 12/2007 |
| JP | 2007/313568 | 12/2007 |
| JP | 2007/125699 | 12/2009 |
| JP | 2010/144120 A | 7/2010 |
| JP | 2011/079877 A | 4/2011 |
| JP | 2011-080379 | 4/2011 |
| WO | 03/023517 | 3/2003 |
| WO | 2006/112887 | 6/2006 |
| WO | 2009/146068 | 12/2009 |
| WO | 2009/146086 | 12/2009 |
| WO | 2010/055601 | 5/2010 |

OTHER PUBLICATIONS

"Morphology of thin block copolymer films on chemically patterned substrates," Chen et al., Journal of Chemical Physics, vol. 108, No. 16, 6897-6905.*
"Mapping Large Regions of Diblock Copolymer Phase Space by Selective Chemical Modification," Davidock et al., Macromolecules, 2004, 37, 397-407.*
"Temperature Dependence of the Interaction Parameter of Polystyrene and Poly(methyl methacrylate)," Russell et al., Macromolecules, 1990, 23, 890-893.*
U.S. Appl. No. 11/545,060, Oct. 5, 2006, Nealey et al.
U.S. Appl. No. 11/580,694, Oct. 12, 2006, Nealey et al.
U.S. Appl. No. 11/879,758, Feb. 17, 2007, Nealey et al.
Asakawa et al. (2002) Nanopatterning with Microdomains of Block Copolymers using Reactive-Ion Etching Selectivity, *Jpn. J. Appl. Phys.* vol. 41 (2002) pp. 6112-6118.
Bates et al. (1990) Block Copolymer Thermodynamics: Theory and Experiment, *Annu. Rev. Phys. Chem.*, 1990, 41: pp. 525-557.
Bates et al. (1995) Isotropic Lifshitz Behavior in Block Copolymer-Homopolymer Blends, *Phy. Rev. Ltrs.*, vol. 75, No. 24, Dec. 11, 1995.
Bates et al. (1997) Polymeric Bicontinuous Microemulsions, *Phy. Rev. Ltrs.*, vol. 69, No. 5, Aug. 4, 1997.
Bates, et al., "Block Copolymers—Designer Soft Materials," *Physics Today*, Feb. 1999, vol. 52, No. 2, pp. 32-38.
Berreman et al. (1990) Use of trilevel resists for high-resolution soft-x-ray projection lithography, *Appl. Phys. Lett.* 56 (22), May 28, 1990, p. 2180.
Black et al. (2001) Integration of self-assembled diblock copolymers for semiconductor capacitor fabrication, *Applied Physics Letters*, vol. 79, No. 3, Jul. 16, 2001, pp. 409-411.
Black et al. (2004) High-Capacity, Self-Assembled Metal-Oxide-Semiconductor Decoupling Capacitors, *IEEE Electron Device Ltrs*, vol. 25, No. 9, Sep. 2004.
Black, C.T., et al, "Polymer Self Assembly in Semiconductor Microelectronics," IBM Journal of Research and Development, *International Business Machines Corporation*, New York, vol. 51, No. 5, Sep. 1, 2007, XP007905680, pp. 605-633.
Bohbot-Raviv, et al., "Discovering New Ordered Phases of Block Copolymers," *The American Physical Society*, vol. 85, No. 16, Oct. 16, 2000, 4 pages.
Boltau et al. (1998) Surface-induced structure formation of polymer blends on patterned substrates, *Nature*, vol. 391, Feb. 1998, p. 877.
Broseta et al. (1990) Phase equilibria in copolymer/homopolymer ternary blends: Molecular weight effects, *J. Chem. Phy.*, 93(4), Aug. 15, 1990.
Burgaz et al. (2000) T-Junction Grain Boundaries in Block Copolymer-Homopolymer Blends, *Macromolecules*, vol. 33, pp. 8739-8745.
Campbell et al. (2000) Fabrication of photonic crystals for the visible spectrum by holographic lithography, *Nature*, vol. 404, Mar. 2, 2000, p. 53.
Cardinale et al. (1999) Demonstration of pattern transfer into sub-100 nm polysilicon line/space features patterned with extreme ultraviolet lithography, *J. Va. Sci. Technol. B* vol. 17(6), Nov./Dec. 1999.
Chan et al. (1999) Ordered Bicontinuous Nanoporous and Nanorelief Cermamic Films from Self Assembling Polymer Precursors, *Science*, 286, 1716 (1999); DOI: 10.1126/science.386.5445.1716.
Chen et al. (1998) Morphology of thin block copolymer films on chemically patterned substrates, *Journal of Chemical Physics*, Apr. 22, 1998, vol. 108, No. 16, p. 6897.

(56) References Cited

OTHER PUBLICATIONS

Cheng et al (2001) Formation of a Cobalt Magnetic Dot Array viz Block Copolymer Lithography, *Adv. Mater. 2001*, 13, No. 15 Aug. 3, 2001, p. 1174-1178.
Cheng et al. (2002) Fabrication of nanostructures with long-range order using block copolymer lithography, *Applied Physics Letters*, vol. 81, No. 19, Nov. 4, 2002, p. 3657-3659.
Cheng et al. (2003) Templated Self-Assembly of Block Copolymers: Effect of Substrate Topography, *Advanced Materials* 2003, vol. 15, No. 19, Oct. 2, pp. 1599-1602.
Corvazier et al. (2001) Lamellar phases and microemulsions in model ternary blends containing amphiphilic block copolymers, *The Royal Society of Chemistry, J. Mater. Chem*, 2001, 11, pp. 2864-2874.
Coulon et al. (1989) Surface-Induced Orientation of Symmetric, Diblock Copolymers: A Secondary Ion Mass Spectrometry Study, *Macromolecules*, vol. 22, pp. 2581-2589.
Coulon et al. (1993) Time Evolution of the Free Surface of Ultrathin Copolymer Films, *Macromolecules*, vol. 26, pp. 1582-1589.
Craig, et al., "Self Assembly of Block Copolymers on Lithographically Defined Nano Patterned Substrate," *Journal of Photopolymer Science & Technology*, vol. 20, No. 4, Jun. 4, 2007, 7 pages.
Daoulas et al. (2006) Fabrication of Complex Three-Dimensional Nanostructures from Self-Assembling Block Copolymer Materials on Two-Dimensional Chemically Patterned Templates with Mismatched Symmetry, *Physical Review Letters*, Jan. 27, 2006, PRL 96, pp. 036104-1-036104-4.
Daoulas et al. (2006) Morphology of multi-component polymer systems: single chain in mean field simulation studies, The Royal Society of Chemistry, *Soft Matter*, 2006, vol. 2, pp. 573-583.
Daoulas, et al., "Directed Assembly of Copolymer Materials on Patterned Substrates: Balance of Simple Symmetries in Complex Structures," *Journal of Polymer Science*, Copyright 2006, vol. 44, pp. 2589-2604.
Daoulas, et al., "Directed Copolymer Assembly on Chemical Substrate patterns: A Phenomenological and Single-Chain-in-Main-Field Simulations Study of the Influence of Roughness in the Substrate Pattern," *American Chemical Society*, Langmuir, published Dec. 8, 2007, vol. 24, pp. 1284-1295.
Detcheverry, et al., Monte Carlo Simulation of Coarse Grain Polymeric Systems, *The American Physical Society*, May 15, 2009, PRL 102(19) 197801(4), pp. 197801-1-197801-4.
Detcheverry, et al., "Theoretically Informed Coarse Grain Simulations of Block Copolymer Melts: Method and Applications," Soft Matter 5 (24), 2008, 4868-4865.
Detcheverry, et al., "Stimulations of Theoretically Informed Course Grain Models of Polymeric Systems," Faraday Discussions, vol. 144, (2010) 111-125 (total 17 pages).
Detcheverry, et al., Monte Carlo Simulations of a Course Grain Model for Block Copolymers and Nanocomposites, published Jun. 11, 2008, vol. 41, pp. 4989-5001.
Düchs et al. (2003) Fluctuation Effects in Ternary AB + A + B Polymeric Emulsions, *Macromolecules* V36, pp. 9237-9248.
Düchs et al. (2004) Formation and structure of the microemulsion phase in two-dimensional ternary AB+A+B Polymeric emulsions, *Jnl of Chem Phy*, vol. 121, No. 6, Aug. 8, 2004, p. 2798.
Edwards, et al., Binary Blends of diblock Copolymers as an Effective route to Multiple, Length Scales in Perfect Directed Self-Assembly of Diblock Copolymer Thin Films, J. Vac. Sci., Technol., vol. 24, No. 1, Jan./Feb. 2006, pp. 340-344.
Edwards et al. (2004) Precise Control over Molecular Dimensions of Block-Copolymer Domains Using the Interfacial Energy of Chemically Nanopatterned Substrates, Advanced Materials, 2004, vol. 16, No. 15, Aug. 4, pp. 1315-1319.
Edwards, E., et al., "Dimensions and Shapes of Block Copolymer Domains Assembled on Lilthographically Defined Chemically Patterned Substrates," *Macromolecules*, vol. 40, Dec. 14, 2006, XP-002540679, pp. 90-96.
Edwards, et al., "Long-Range Order and Orientation of Cylinder-Forming Block Copolymers on Chemically Nanopatterned Striped Surfaces," *American Chemical Society*, Macromolecules, published Apr. 13, 2006, vol. 39, pp. 3598-3607.
Edwards, et al., "Mechanism and Kinetics of Ordering in Diblock Copolymer Thin Films on Chemically Nanopatterned Substrates," *Journal of Polymer Science*: Part B, Polymer Physics, 2005, vol. 43, pp. 3444-3459.
Ekinci, et al., "20 nm Line/Space Patterns in HSQ Fabricated by EUV Interference Lithography," Photon Lithography, MNE 2006 Micro-and Nano-Engineering, 2 pages.
Fasolka et al. (2000) Morphology of Ultrathin Supported Diblock Copolymer Films: Theory and Experiment, *Macromolecules* vol. 33, pp. 5702-5712.
Floudas et al. (1997) Microphase separation in block copolymer/homopolymer blends: Theory and experiment, *J. Chem. Phys.* 106 (8), Feb. 22, 1997, p. 3318.
Fukukawa et al. (2005) Synthesis and Characterization of Silicon-Containing Block Copolymers from Nitroside-Mediated Living Free Radical Polymerization, *Macromolecules* vol. 38, pp. 263-270.
Galatsis, K., et al., Patterning and Templating for Nanoelectronics, *Advanced Materials*, 2010, vol. 22, pp. 769-778.
Han, et al., "Effect of Composition of Substrate-Modifying Random Copolymers on the Orientation of Symmetric and Asymmetric Diblock Copolymer Domains," *American Chemical Society*, Published Nov. 6, 2008, vol. 41, pp. 9090-9097.
Han, et al., Perpendicular Orientation of Domains in Cylinder-Forming Block Copolymer Thick Films by Controlled Interfacial Interactions, *American Chemical Society*, Macromolecules Article, Published Jun. 11, 2009, vol. 42, pp. 4896-4901.
Helfand et al. (1972) Theory of the Interface between Immiscible Polymers, II, *Journal of Chemical Physics*, vol. 56, No. 7, Apr. 1, 1972, pp. 3592-3601.
Hillmyer et al. (1991) Model Bicontinuous Microemulsions in Ternary Homopolymer/Block Copolymer Blends, *J. Phy. Chem.* B 1999, 103, pp. 4814-4824.
Hirai, et al., "One-Step Direct-Patterning Template Utilizing Self-Assembly of POSS-Containing Block Copolymers," *Adv. Mater.*, 2009, vol. 21, pp. 4334-4338.
Hong, A., et al., "Metal Nanodot Memory by Self-Assembled Block Copolymer Lift-Off," *American Chemical Society*, Nano Left 2010, vol. 10, pp. 224-229.
Huang et al. (1991) Modeling Copolymer Adsorption on Laterally Heterogeneous Surfaces, *Physical Review Letters*, Feb. 4, 1991, vol. 66, No. 5, p. 620.
In, et al., Side-Chain-Grafted Random Copolymer Brushes as Neutral Surfaces for Controlling the Orientation of Block Copolymer Microdomains in Thin Films, *American Chemical Society*, Langmuir, published Aug. 1, 2006, vol. 22, pp. 7855-7860.
Jeong et al. (2002) Asymmetric Block Copolymers with Homopolymers: Routes to Multiple Length Scale nanostructures, *Adv. Mater.* 2002., 14, No. 4, Feb. 19, 2002, p. 274.
Jeong et al. (2003) Precise Control of Nanopore Size in Thin Film Using Mixtures of Asymmetric Block Copolymer and Homopolymer, Macromolecules 2003, 36, pp. 10126-10129.
Ji, et al., "Generalization of the Use of Random Copolymers to Control the Wetting Behavior of Block Copolymer Films," American Chemical Society, published Nov. 11, 2008, vol. 41, pp. 9098-9103.
Ji, et al., "Preparation of Neutral Wetting Brushes for Block Copolymer Films from Homopolymer Blends," Advanced Materials, 2008 vol. 20, pp. 3054-3060.
Ji, Shengxiang, et al., "Molecular Transfer Printing Using Block Copolymers," *ACS Nano* vol. 4, No. 2, 2010, pp. 599-609.
Kang, et al., "Control of the Critical Dimensions and Line Edge Roughness With Pre-Organized Block Copolymer Pixelated photoresists," *J. Vac. Sci. Technol.* vol. 27, No. 6, Nov./Dec. 2009, pp. 2993-2997.
Kang, et al., "Hierarchical Assembly of Nanoparticle Superstructures from Block Copolymer-Nanoparticle Composites," published Apr. 9, 2008, vol. 100(4), pp. 148303-1-148303-4.
Kang, et al., "Directed Assembly of Asymmetric Ternary Block Copolymer-Homopolymer Blends Using Symmetric Block Copolymer into Checkerboard Trimming Chemical Patterns," *J. Vac. Sci. Technol.*, vol. 26, No. 5, Nov./Dec. 2008, pp. 2495-2499.

(56) References Cited

OTHER PUBLICATIONS

Kim et al. (2000) Chemical Modification of Self-Assembled Monolayers by Exposure to Soft X-rays in Air, *J. Phys. Chem.*, vol. 104, No. 31, 2000, pp. 7403-7410.

Kim et al. (2003) Epitaxial self-assembly of block copolymers on lithographically defined nanopatterned substrates, *Nature*, vol. 424, Jul. 24, 2003, *Nature* Publishing Group, pp. 411-414.

Kim, et al., "Defect Structure in Thin Films of a Lamellar Block Copolymer Self-Assemble on Neutral Homogeneous and Chemically Nanopatterned Surfaces," American Chemical Society, *Macromolecules*, published Jul. 13, 2006, vol. 39, 5466-5470.

Kim, et al., "Synthesis of Photoacid Generator-Containing Patternable Diblock Copolymers by Reversible Addition—Fragmentation Transfer Polymerization," Chemistry of Materials, *American Chemical Society*, Jul. 6, 2009, pp. 3030-3032.

Krishnan et al. (2001) Shear-Induced Nano-Macro Structural Transition in a Polymeric Bicontinuous Microemulsion, *Phy Rev Ltrs*, vol. 87, No. 9, Aug. 27, 2001, p. 098301-1.

La, et al., "Directed Assembly of Cylinder-Forming Block Copolymer Films and Thermochemically Induced Cylinder to Sphere Transition: A Hierarchical Route to Linear Arrays of Nanodots," Nano Letter 2005, published May 28, 2005, *American Chemical Society*, vol. 5, No. 7, pp. 1379-1384.

La, et al, "Directed Assembly of Cylinder-Forming Block Copolymers into Patterned Structures to Fabricate Arrays of Spherical Domains and Nanoparticles," *Chemistry of Materials*, 2007:19(18), pp. 4538-4544.

Li et al. (2000) Dense arrays of ordered GaAs nanostructures by selective area growth on substrates patterned by block copolymer lithography, *Applied Physics Letters*, vol. 76, No. 13, Mar. 27, 2000, pp. 1689-1691.

Liu, et al., "Modification of a Polystyrene Brush Layer by Insertion of Poly(methyl methacrylate) Molecules," *J. Vac Sci. Technol.*, vol. 27, No. 6, Nov./Dec. 2009 3038-3042.

Liu, et al., "Phase Behavior and Dimensional Scaling of Symmetric Block Copolymer—Homopolymer Ternary Blends in Thin Films," *American Chemical Society*, Macromolecules, vol. 42 Mar. 26, 2009, pp. 3063-3072.

Mansky et al. (1997) Ordered Diblock Copolymer Films on Random Copolymer Brushes, Macromolecules 1997, 30, pp. 6810-6813.

Mansky et al. (2006) Controlling Polymer-Surface Interactions with Random Copolymer Brushes, 1997, vol. 275, pp. 1458-1460.

Messe et al. (2003) Effect of the Molecular weight of the homopolymers on the morphology in ternary blends of polystyrene, polyisoprene, polystyrene-block-polyisoprene copolymer, Polymer, 44 (2003) pp. 7397-7403.

Morkved et al. (1999) Dynamics of ternary polymer blends: Disordered, ordered and bicontinuous microemulsion phases, Faraday Discuss., 1999, 112, pp. 335-350.

Morkved et al. (2001) Static and Dynamic Scattering from Ternary Polymer Blends: Bicontinuous Microemulsions, Lifshitz lines, and amphiphilicity, Jnl of Chem Phy, V.114, No. 16, Apr. 22, 2001, p. 7247.

Morin, et al., "Assembly of Nanocrystal Arrays by Block-Copolymer-Directed Nucleation," *Angew. Chem. Inc.*, Ed. 2009, vol. 48, pp. 2135-2139.

Mortensen et al. (2000) Ternary mixture of homopolymer blend and diblock copolymer studied near the Lifshitz composition by small-angle neutron scattering, *J. Appl. Cryst.*, 2000, 33, pp. 686-689.

Muller et al. (2005) Phase Separation in Binary Mixtures Containing Polymers: A Quantitative Comparison of Single-Chain-In-Mean-Field Simulations and Computer Simulations of the Corresponding Multichain Systems, *Jnl of Polymer Science: Part B: Polymer Physics*, vol. 43, pp. 934-958; published on-line in Wiley InterScience (www.interscience.wiley.com).

Naito et al. (2002) 2.5-Inch Disk Patterned Media Prepared by an Artificially Assisted Self-Assembling Method, *IEEE Trans. on Magnetics*, vol. 38, No. 5, Sep. 2002, p. 1949.

Nakano, et al., Single-Step Single-Molecule PCR of DNA with a Homo-Priming Sequence Using a Single Primer and Hot-Startable DNA Polymerase, Journal of Bioscience and Bioengineering, 2000, vol. 90 No. 4, pp. 456-458.

Nath, et al., "Density Functional Theory of Molecular Structure for Thin Diblock Copolymer Films on Chemically Heterogeneous Surfaces," Journal of Chemical Physics, vol. 110 No. 15, Apr. 15, 1999, pp. 7483-7490.

Orso et al. (1999) Phase Behavior of Thin Film Blends of Block Copolymers and Homopolymers: Changes in Domain Dimensions, *Macromolecules*, 32, pp. 1087-1092.

Park et al. (1997) Block Copolymer Lithography: Periodic Arrays of $\sim 10^{11}$ Holes in 1 Square Centimeter, *Science*, vol. 276, May 30, 1997, pp. 1401-1404.

Park et al. (2003) Enabling nanotechnology with self assembled block copolymer patterns, Polymer, vol. 44 (2003) pp. 6725-6760; www.sciencedirect.com.

Park, et al., "Characterization of Cylinder-Forming Block Copolymers Directed to Assemble on Spotted Chemical Patterns," *American Chemical Society, Macromolecules*, Published Nov. 4, 2008, vol. 41, No. 23, pp. 9118-9123.

Park, et al., "Combinatorial Generation and Replication-Directed Assembly of Complex and Varied Geometries with Thin Films of Diblock Copolymers," *American Chemical Society*, Langmuri, published Jul. 24, 2007, vol. 23, pp. 9037-9045.

Park, et al., "Controlled growth of InGaAs/InGaAsP Quantum Dots on InP Substrates Employing Diblock Copolymer Lithography," *American Institute of Physics*, Allied Physics Letters 95, 2009, pp. 113111-1 to 113111-3.

Park, et al., "Selective Growth and Characterization of InGaAs Quantum Dots on Patterned InP Substrates Utilizing a Diblock Copolymer Template," IEEE 978-4244-3433-6/09, copyright 2009, pp. 52-54.

Park, et al., "Square Arrays of Vertical Cylinders of PS-b-PMMA on Chemically Nanopatterned Surfaces," *American Chemical Society*, Macromolecules, published Jul. 15, 2007, vol. 40, pp. 5084-5094.

Park, Sang-Min, "Morphological Reconstruction and Ordering in Films of Sphere-Forming Block Copolymers on Striped Chemically Patterned Surfaces," *American Chemical Society*, published Nov. 4, 2008, vol. 41, pp. 9124-9129.

Park, et al., "Nano-Scale Selective Growth and Optical Characteristics of Quantum Dots on III-V Substrates Prepared by Diblock Copolymer Nano-Patterning," Journal of Nanophotonics, 3 (1), 031604, Jan. 30, 2009, pp. 1-12.

Pereira et al. (1998) Diblock Copolymer Thin Films on Heterogeneous Striped Surfaces: Commensurate, Incommensurate and inverted Lamellae, *Physical Review Letters*, vol. 80, No. 13, Mar. 30, 1998, p. 2849.

Peters et al. (2000) Using Self-Assembled Monolayers Exposed to X-rays to Control the Wetting Behavior of Thin Films of Diblock Copolymers, *Langmuir*, vol. 16, No. 10, 2000, pp. 4625-4631.

Peters, et al., A Near Edge X-ray Absorption Fine Structure Spectroscopy Investigation of the Structure of Self Assembled Films of Octadecyltrichlorosilane, *American Chemical Society*, Langmuir, published Jan. 24, 2002, vol. 18, pp. 1250-1256.

Peters, et al., "Combining Advanced Lithographic Techniques and Self-Assembly of Thin Films of Diblock Copolymers to Produce Templates for Nanofabrication," *J. Vac Sci. Technol.*, vol. 18(6), Nov./Dec. 2000, pp. 3530-3534.

Peters, et al., "Morphology of Thin Films of Diblock Copolymers on Surfaces Micropatterned with Regions of Different Interfacial Energy," *American Chemical Society*, Macromolecules, published Jan. 26, 2002, vol. 35, pp. 1822-1834.

Peters, et al., "Wetting Behavior of Block Copolymers on Self Assembled Films of Alkylchlorosiloxanes: Effect of Grafting Density," *American Chemical Society*, Langmuir, published Oct. 21, 2000, vol. 16, pp. 9620-9626.

Pike, et al., "Theoretically Informed Coarse Grain Simulations of Polymeric Systems," *The Journal of Chemical Physics*, Published Aug. 27 2009, vol. 131, pp. 084903-1to 084903-10.

Preliminary Examination Report dated May 30, 2007 issued in PCTUS2005/042568.

(56) References Cited

OTHER PUBLICATIONS

Rockford et al. (1999) Polymers on Nanoperiodic, Heterogeneous Surfaces, *Phy. Rev. Ltrs, The American Physical Society*, vol. 82, No. 12, pp. 2602-2605.
Ruiz, et al., "Density Multiplication and Improved Lithography by Directed block Copolymer Assembly," Science, vol. 321, Aug. 15, 2008, pp. 936-939.
Russell et al. (1989) Characteristics of the Surface-Induced Orientation for.Symmetric Diblock Ps/Pmma Copolymers, Macromolecules, vol. 22, pp.4600-4606.
Schattenburg ct al. (1995) Optically matched trilevel resist process for nanostructure fabrication, *J. Vac. Sci. Technol.* B, 15(6), Nov./Dec. 1995, p. 3007.
Schwahn et al. (1999) Crossover from 3D Ising to Isotropic Lifshitz Critical Behavior in a Mixture of a Homopolymer Blend and Diblock Copolymer, *Phy. Rev. Ltrs, The American Physical Society*, vol. 82, No. 25, Jun. 21, 1999, p. 5056.
Schwahn et al. (2000) Thermal Composition fluctuations near the isotropic Lifshitz critical point in a Ternary mixture of a homopolymer blend and diblock copolymer, *Jnl. Chem. Phy.*, vol. 112 , No. 12, Mar. 22, 2000, p. 5454.
Solak, et al., "Sub-50 nm Period Patterns With EUV Interference. Lithography," *Microelectronic Engineering* 67-68 (2003) 56-62.
Solak, Harun H. (2006) Nanolithography with coherent extreme ultraviolet light, *Jnl. of Physics D: App. Phys.*, 39 (2006) R171-R188.
Son, et al., "Placement Control of Nanomaterial Arrays on the Surface-Reconstructed Block Copolymer Thin Films," *ACSNano*, vol. 3, No. 12, 2009, pp. 3927-3934.
Son, et al., "Surfactant-Assisted Orientation of Thin Diblock Copolymer films," *Advanced Materials*, 2008, vol. 20, pp. 3643-3648.
Stoykovich et al. (2005) Directed Assembly of Block Copolymer Blends into Nonregular Device-Oriented Structures, *Science*, vol. 308, No. 5727, Jun. 3, 2005, www.sciencemag.org, pp. 1442-1446.
Stoykovich et al. (2006) Phase Behavior of Symmetric Ternary Block Copolymer-Homopolymer Blends in Thin Films and on Chemically Patterned Surfaces, *Physical Review Letters*, Oct. 6, 2006, PRL 97, 147802 (2006).
Stoykovich, M.P., et al, "Block Copolymers and Conventional Lithography," *Materials Today*, Elsevier Science, Kidlington, GB, vol. 9, No. 9, Sep. 1, 2006, pp. 20-29.
Stoykovich, M.P., et al, "Remediation of Line Edge Roughness in Chemical Nanopatterns by the Directed Assembly of Overlying Block Copolymer Films," Macromolecules, *American Chemical Society*, vol. 43, Feb. 10, 2010, pp. 2334-2342.
Stoykovich, Mark P., et al., "Methods and Compositions for Forming Patterns With Isolated or Discrete Features Using Block Copolymer Materials," U.S. Appl. No. 11/879,758, filed Jul. 17, 2007.
Stuen, et al., In situ Characterization of Block Copolymer Ordering on Chemically Nanopatterned Surfaces by time-resolved small angle X-ray Scattering, *J Vac. Sci. Technol.* vol. 26(6), published Dec. 1, 2008, pp. 2504-2508.
Stuen, K., et al., "Dimensional Scaling of Cylinders in Thin Films of Block Copolymer-Homopolymer Ternary Blends," *Am. Chem. Society*, Macromolecules Jun. 25, 2009, vol. 42, pp. 5139-5145.
Stuen, K., et al., "Imaging Layers for the Directed Assembly of Block Copolymer Films: Dependence of the Physical and Chemical Properties of Patterned Polymer Brushes on Brush Molecular Weight," *Journal of Vacuum Science and Technology*, Part B, AVS/AIP, Melville, New York, vol. 25, No. 6, Dec. 6, 2007, pp. 1958-1962.
Suh, Hyo Seon, et al., "Orientation of Block Copolymer Resists on Interlayer Dielectrics with Tunable Surface Energy," *American Chemical Society*, vol. 43, Nov. 13, 2009, pp. 461-466.
Teubner et al. (1987) Origin of the Scattering Peak in Microemulsions, *J. Chem. Phys.*, 87(5), Sep. 1, 1997, p. 3195.
Thurn-Albrecht et al. (2000) Nanoscopic Templates from Oriented Block Copolymer Films, Communications, *Advanced Materials*, vol. 12, No. 11, pp. 787-791.
Thurn-Albrecht et al. (2000) Ultrahigh-Density Nanowire Arrays Grown in Self-Assembled Diblock Copolymer Templates, *Science*, Dec. 15, 2000, vol. 290, pp. 2126-2129.
Ting, et al., "Plasma Etch Removal of Poly (methyl methacrylate) in Block Copolymer Lithography," *J. Vac. Sci. Technol.*, vol. 26(5), Sep./Oct. 2008, pp. 1684-1689.
Torikai et al. (1997) Lamellar Domain Spacings of Diblock Copolymer/Homopolymer Blends and Conformations of Block Chains in Their Microdomains, *Macromolecules*, 30, pp. 5698-5703.
Urbas et al. (2000) Tunable Block Copolymer/Homopolymer Photonic Crystals, *Advanced Materials*, vol. 12, No. 11 p. 812.
Urbas et al. (2002) Bicontinuous Cubic Block Copolymer Photonic Crystals, *Advanced Materials*, vol. 14, No. 24, Dec. 17, 2002, p. 1850.
Wang et al. (2000) Symmetric diblock copolymer thin films confined between homogeneous and patterned surfaces: Simulations and theory, *Journal of Chemical Physics*, vol. 112, No. 22, Jun. 8, 2000, pp. 9996-10010.
Wang, et al., Behavior of Single Nanoparticle/ Homopolymer Chain in Ordered Structures of Diblock Copolymers, *Journal of Chemical Physics*, Jun. 22, 2003, vol. 118, No. 24, pp. 11278-11285.
Wang, et al., "Lamellar Structures of Symmetric Diblock Copolymers: Comparisons Between Lattice Monte Carlo Simulations and Self-Consistent Mean-Field Calculations," *American Chemical Society*, Macromolecules, published Nov. 8, 2002, vol. 35, pp. 9563-9573.
Wang, et al., "Monte Carlo Simulations of Asymmetric Diblock Copolymer Thin Films Confined Between two Homogeneous Surfaces," *American Chemical Society*, Macromolecules, published Apr. 6, 2001, vol. 34, pp. 3458-3470.
Wang, et al., "Simulations of the Morphology of Cylinder-Forming Asymmetric Diblock Copolymer Thin Films on Nanopatterned Substrates," *American Chemical Society*, Macromolecules published Feb. 7, 2003, vol. 36, pp. 1731-1740.
Wang, et al., Monte Carlo Simulations of Diblock Copolymer Thin Films Confined Between Chemically Heterogeneous Hard Surfaces, *American Chemical Society*, Macromolecules, published May 17, 2000, vol. 33, pp. 4512-4525.
Wang, et al., Monte Carlo Simulations of Diblock Copolymer Thin Films Confined Between two Homogeneous Surfaces, Journal of Chemical Physics, Jan. 1, 2000, 112(1): 450-464.
Welander, et al., "Impact of Trench Width Roughness on the Graphoepitaxial Assembly of Block Copolymers," *J. Vac Sci. Technol.*, vol. 26(6), Nov./Dec. 2008, pp. 2484-2489.
Welander, et al., "Rapid Directed Assembly of Block Copolymer Films at Elevated Temperatures," *American Chemical Society*, Macromolecules, vol. 41, Published Apr. 1, 2008, pp. 2759-2761.
Whitesides et al. (1991) Molecular self-Assembly and Nanochemistry: A Chemical Strategy for the Synthesis of Nanostructures, Articles, *Science* vol. 254, p. 1312, Nov. 29, 1991.
Whitesides et al. (2002) Self-Assembly at All Scales, *Science*, AAAS, 295, p. 2418.
Xiao, et al., "Graphoepitaxy of Cylinder-forming Block Copolymers for Use as Templates to Pattern Magnetic Metal Dot Arrays," Institute of Physics Publishing, *Nanotechnology*, vol. 16, No. 7, 2005, pp. S324-S329.
Xu et al. (2001) The Influence of molecular weight on nanoporous polymer films, *Polymer*, 42 (2001) pp. 9091-9095; www.elsevier.com/locate/polymer.
Yang et al. (2000) Guided Self-Assembly of Symmetric Diblock Copolymer Films on Chemically Nanopatterned Substrates, *Macromolecules 2000*, 33, pp. 9575-9582.
Yang et al., "Imaging the Substrate Film Interface of Thin Films of Diblock Copolymers on Chemically Patterned Surfaces," *American Chemical Society*, Macromolecules, published Feb. 16, 2002, vol. 35, pp. 2406-2409.
Yang, et al., "Patterning of Self-Assembled Monolayers with Lateral Dimensions of 0.15 um Using Advanced Lithography," *J. Vac Sci. Technol.*, vol. 17(6), Nov./Dec. 1999, pp. 3203-3207.
Yang, et al., "Proximity X-ray Lithography Using Self-Assembled Alkylsiloxane Films: Resolution and Pattern Transfer," *American Chemical Society*, Langmuir, published Dec. 8, 2000, vol. 17, 228-233.

(56) References Cited

OTHER PUBLICATIONS

Nealey, Paul Franklin, et al., "Density Multiplication and Improved Lithography by Directed Block Copolymer Assembly," U.S. Appl. No. 12/329,484, filed Dec. 5, 2008.
International Search Report and Written Opinion of the International Searching Authority mailed Aug. 24, 2009, Application No. PCT/US2008/085742, 14 pages.
International Search Report and Written Opinion of the International Searching Authority mailed Dec. 16, 2009, Application No. PCT/US2009/039208.
U.S. Office Action mailed Jul. 31, 2009, from U.S. Appl. No. 11/286,260.
U.S. Office Action mailed Jan. 25, 2010, from U.S. Appl. No. 11/286,260.
International Search Report and Written Opinion dated May 2, 2007 issued in WO2006112887.
U.S. Office Action mailed Apr. 3, 2009, from U.S. Appl. No. 11/545,060.
U.S. Office Action mailed Nov. 30, 2009, from U.S. Appl. No. 11/545,060.
U.S. Office Action mailed Dec. 2, 2009, from U.S. Appl. No. 11/580,694.
U.S. Office Action mailed Jul. 23, 2009, from U.S. Appl. No. 11/879,758.
U.S. Final Office Action mailed Mar. 8, 2010, from U.S. Appl. No. 11/879,758.
U.S. Office Action mailed Jun. 25, 2010, from U.S. Appl. No. 11/286,260.
U.S. Office Action mailed Jul. 12, 2010, from U.S. Appl. No. 11/545,060.
U.S. Final Office Action mailed Jun. 10, 2010, from U.S. Appl. No. 11/580,694.
Todo et al., "Domain-Boundary Structure of Styrene-Isoprene Block Copolymer Films Cast From Solutions .III. Preliminary-Results on Spherical Microdomains," *Polymer Engineering and Science*, 17 (8): 587-597 1977.
Morkved et al., "Local control of microdomain orientation in diblock copolymer thin films with electric fields," Science, 273 (5277): 931-933 Aug. 16, 1996, pp. 931-933.
Kim, S.H., et al., "Highly oriented and ordered arrays from block copolymers via solvent evaporation," *Advanced Materials*, Feb. 3, 2004, 16 (3), pp. 226-231.
Fasolka, MJ, et al., Block copolymer thin films: Physics and applications, Annual Review of Materials Research, 2001, 31, pp. 323-355.
Tanaka, H, et al., "Ordered Structure in Mixtures of a Block Copolymer and Homopolymers . 1. Solubilization of Low-Molecular-Weight Homopolymers," Macromolecules, 24 (1), Jan. 7, 1991, pp. 240-251.
Hamley, et al., Nanostructure fabrication using block copolymers, *Nanotechnology*, Oct. 2003, 14 (10), pp. R39-R54.
Segalman, RA, et al., "Graphoepitaxy of spherical domain block copolymer films," Advanced Materials, Aug. 3, 2001, 13 (15) pp. 1152-1155.
U.S. Office Action mailed Dec. 27, 2010, from U.S. Appl. No. 11/545,060.
Office Action mailed Oct. 7, 2010 for U.S. Appl. No. 12/416,816.
U.S. Final Office Action mailed Dec. 13, 2010, from U.S. Appl. No. 11/286,260.
U.S. Office Action mailed Mar. 15, 2011, from U.S. Appl. No. 11/545,060.
U.S. Office Action mailed Dec. 17, 2010, from U.S. Appl. No. 11/545,060.
Office Action mailed Apr. 20, 2011 for U.S. Appl. No. 12/416,816.
Office Action mailed Apr. 21, 2011 for U.S. Appl. No. 12/329,484.
Watanabe, et al., "Smart Block Copolymer Masks With Molecule-Transport Channels for Total Wet Nanopatterning," J. Mater. Chem, 2008, vol. 18, 5482-5491.
Final Office action mailed Jul. 8, 2011, U.S. Appl. No. 11/879,758.

Final Office Action mailed Oct. 14, 2011 for U.S. Appl. No. 12/329,484.
Office Action mailed Aug. 31, 2011 for U.S. Appl. No. 12/416,816.
Final Office Action mailed Sep. 1, 2011, from U.S. Appl. No. 11/545,060.
Supplemental European Search Report mailed Oct. 26, 2011, from U.S. Application No. 05857837.8.
Notice of Allowance mailed Nov. 2, 2011 for U.S. Appl. No. 12/416,816.
Notice of Allowance mailed Nov. 4, 2011 for U.S. Appl. No. 11/879,758.
Notice of Allowance mailed Dec. 21, 2011, for U.S. Appl. No. 11/545,060.
Nealey, Paul Franklin, "Solvent Annealing Block Copolymers on Patterned Substrates," U.S. Appl. No. 13/367,337, filed Feb. 6, 2012.
Japanese Office Action mailed Jul. 3, 2012, Application No. 2007-543480.
Nealey, Paul Franklin, "Improved Patterning in the Directed Assembly of Block Copolymers Using Triblock or Multi-Block Copolymers," U.S. Appl. No. 13/543,667, filed Jul. 6, 2012.
Office Action mailed Apr. 11, 2012 for U.S. Appl. No. 12/329,484.
Office Action mailed Aug. 15, 2012 for U.S. Appl. No. 13/436,341.
Facsko, et al., Formation of Ordered Nanoscale Semiconductor Dots by Ion Sputtering, Science, vol. 285, Sep. 3, 1999 pp. 1551-1553.
Kim, S., et al, "Decoupling Bulk Thermodynamics and Wetting Characteristics of Block Copolymer Thin Films," ACS Macro Lett., American Chemical Society, pp. 11-14.
Notice of Allowance mailed Jun. 7, 2012, for U.S. Appl. No. 11/286,260.
U.S. Office Action mailed Oct. 15, 2012, from U.S. Appl. No. 11/580,694.
U.S. Office Action mailed Sep. 24, 2012, from U.S. Appl. No. 13/366,134.
Final Office Action mailed Dec. 18, 2012, for U.S. Appl. No. 12/329,484.
Notice of Allowance mailed Apr. 5, 2012, from U.S. Appl. No. 13/366,134.
Ho, Chih-Shing, "Precision of Digital Vision Systems," IEEE Transaction on Pattern Analysis and Machine Intelligence, vol. PAMI-5, No. 6, Nov. 1983, pp. 593-601.
International Search Report and Written Opinion mailed Dec. 5, 2012.
Nealey, Paul Franklin, et al. "Directed Assembly of Block Copolymer Films Between a Chemically Patterned Surface and a Second Surface," U.S. Appl. No. 13/543,681, filed Jul. 6, 2012.
Nealey, Paul Franklin, et al. "Topcoat Surfaces for Directing the Assembly of Block Copolymer Films on Chemically Patterned Surfaces," U.S. Appl. No. 13/601,460, filed Aug. 31, 2012.
Final Office Action mailed May 31, 2013, from U.S. Appl. No. 11/580,694.
Notice of Allowance mailed Sep. 6, 2013, from U.S. Appl. No. 11/580,694.
Office Action mailed Jul. 12, 2013 for U.S. Appl. No. 12/329,484.
Notice of Allowance mailed Sep. 5, 2013 for U.S. Appl. No. 13/436,341.
Nealey, Paul Franklin, "Fabrication of Complex Three-Dimensional Structures Based on Directed Assembly of Self-Assembling Materials on Activated Two-Dimensional Templates," U.S. Appl. No. 14/092,551, filed Nov. 27, 2013.
Final Office Action mailed May 8, 2014 for U.S. Appl. No. 12/329,484.
International Search Report and Written Opinion mailed on Nov. 26, 2013, issued in Application No. PCT /US2013/056792.
Office Action mailed Nov. 24, 2014, for U.S. Appl. No. 13/367,337.
Hanley, et al., Phase Behavior of a Block Copolymer in Solvents of Varying Selectivity, *Macromolecules* Jul. 7, 2000, vol. 33, pp. 5918-5931.
Ho et al., "Solvent-induced microdomain orientation in polystyrene-b-poly(L-lactide) diblock copolymer thin films for nanopatterning," Polymer, vol. 46, (2005), pp. 9362-9377.

(56) References Cited

OTHER PUBLICATIONS

Kim, et al., "Solvent-Induced Ordering in Thin Film Diblock Copolymer/Homopolyer Mixtures," Adv. Mater., vol. 16, No. 23-24, Dec. 17, 2004, pp. 2119-2123.
Kim, et al., Morphological Development in Solvent-Cast Polystyrene-Polybutadiene-Polystyrene (SBS) Triblock Copolymer Thin Films, Macromolecules, vol. 31, Mar. 31, 1998, pp. 2369-2577.
Lin, et al., "A Rapid Route to Arrays of Nanostructures in Thin Films," Adv. Mater., vol. 14, No. 19, Oct. 2, 2002, pp. 1373-1376.
Lodge, et al., "Phase Behavior of Block Copolymers in a Neutral Solvent," Macromolecules, vol. 36, No. 3, Jan. 3, 2003, pp. 816-822.
Mori, et al, "Order-disorder transition of polystyrene-block-polyisoprene Part II. Characteristic length as a function of polymer concentration, molecular weight, copolymer composition, and x parameter," Polymer, vol. 42, 2001, pp. 3009-3021.
Shibayama, et al., Ordered Structure in Block Polymer Solutions. 3. Concentration Dependence of Microdomains in Nonselective Solvents, J. Am. Chem. Soc., Vo. 16, 1983, pp. 1427-1433.
Sidorenko, et al., "Ordered Reactive Nanomembranes/Nanotemplates from Thin Films of Block Copolymer Supramolecular Assembly," J. Am. Chem. Soc., vol. 125, 2003, pp. 1221-12216.
Ramirez-Hernandez, A, et al., "Symmetric Diblock Copolymers Confined by Two Nanopatterned Surfaces," Department of Chemical and Biological Engineering, University of Wisconsin-Madison, Madison, Wisconsin 53706, Sep. 6, 2011, 10 pages.
Office Action mailed Jun. 19, 2015 for U.S. Appl. No. 13/543,667.
Office Action mailed Mar. 27, 2015 for U.S. Appl. No. 12/329,484.
Notice of Allowance mailed Jun. 29, 2015 for U.S. Appl. No. 12/329,484.
Office Action mailed Jun. 16, 2015 for U.S. Appl. No. 13/543,667.
Final Office Action mailed Jul. 16, 2015, for U.S. Appl. No. 13/367,337.
Albert, et al., "Self-Assembly of Block Copolymer Thin Films," Materials Today, Jun. 2010, vol. 13, No. 6, 24-33.
Office Action mailed Sep. 10, 2015 for U.S. Appl. No. 13/543,681.
Office Action mailed Aug. 26, 2015 for U.S. Appl. No. 13/601,460.
Notice of Allowance mailed Oct. 7, 2015 for U.S. Appl. No. 13/367,337.
Elb, Hubert, et al., "Microdomain Morphology of Thin ABC Triblock Copolymer Films", Macromolecules, American Chemical Society, Jan. 27, 1999, vol. 32, No. 4, pp. 1204-1211.
Notice of Allowance dated Feb. 24, 2016, issued in U.S. Appl. No. 13/543,667.
U.S. Office Action dated Jan. 15, 2016, issued in U.S. Appl. No. 14/092,551.
Attard, Phil, "Non-periodic boundary conditions for molecular simulations of condensed matter," Molecular Physics, vol. 104, No. 12, Jun. 20, 2006, pp. 1951-1960.
Hillmyer, Marc A., "Nanoporous Materials from Block Copolymer Precursors," *Adv Polym Sci*, 2005, vol. 190, pp. 137-181.
U.S. Notice of Allowance dated Aug. 12, 2016, issued in U.S. Appl. No. 14/092,551.
JP Office Action dated Sep. 20, 2016, issued in Application No. 2012-204273.
Final Office Action mailed Jul. 1, 2016 for U.S. Appl. No. 13/543,681.

\* cited by examiner

Spheres  ⊥ Cylinders

|| Cylinders  Lamellae

PS preferential top-surface non-preferential top-surface

PMMA preferential top-surface (a) $L_z = 0.5L_0$  (b) $L_z = 1.0L_0$  (c) $L_z = 1.5L_0$  (d) $L_z = 2.0L_0$ (a) $L_z = 0.5L_0$ (b) $L_z = 1.0L_0$ (c) $L_z = 1.5L_0$ (d) $L_z = 2.0L_0$ (a) $W = 0.5 L_0$ (b) $W = 0.8 L_0$ (c) $W = 1.0 L_0$

DIRECTED ASSEMBLY OF BLOCK COPOLYMER FILMS BETWEEN A CHEMICALLY PATTERNED SURFACE AND A SECOND SURFACE

CROSS-REFERENCE TO RELATED APPLICATION

This application claims benefit of priority under 35 USC §119(e) to U.S. Provisional Patent Application No. 61/535,210, filed Sep. 15, 2011, which is incorporated by reference herein in its entirety.

STATEMENT OF GOVERNMENT SUPPORT

This invention was made with government support under 0832760 awarded by the National Science Foundation. The government has certain rights in the invention.

BACKGROUND OF THE INVENTION

Advanced nanoscale science and engineering have driven the fabrication of two-dimensional and three-dimensional structures with nanometer precision for various applications including electronics, photonics and biological engineering. Traditional patterning methods such as photolithography and electron beam lithography that have emerged from the microelectronics industry are well suited to fabricate two-dimensional features on ultraflat silicon and glass surfaces. However, building three-dimensional device structures involves repeated photoresist patterning and pattern transfer processes.

SUMMARY

Provided are methods of fabricating thin film structures that involve assembling block copolymer materials in the presence of condensed phase surfaces on both sides of the thin film, at least one of which is a chemically patterned surface configured to direct the assembly of the block copolymer material. According to various embodiments, the other of the condensed phase surfaces can be a chemically homogenous surface or a chemically patterned surface. Also provided are structures, morphologies, and templates formed in the domain structure of block copolymer materials. In certain embodiments, complex 3-D morphologies and related structures not present in bulk block copolymer materials are provided.

One aspect relates to methods of assembling a block copolymer material in the presence of condensed-phase boundary conditions on both sides of the film in which one of the boundary conditions is a chemically patterned surface and the second boundary condition is a chemically homogeneous surface. Examples of chemically patterned surfaces include patterned polymer brushes or mats, chemically patterned self-assembled monolayers, and patterned resists. The chemically patterned surface typically has at least one dimension within an order of magnitude of a domain of the block copolymer material, such that it can drive the assembly of the block copolymer material. Examples of chemically homogenous surfaces include copolymers. In some embodiments, a chemically homogenous surface can illicit non-preferential wetting of two or more blocks of the block copolymer material. In some other embodiments, a chemically homogenous surface can illicit preferential wetting by one or more blocks of the block copolymer material.

Another aspect relates to methods of assembling a block copolymer material in the presence of condensed-phase boundary conditions on both sides of the film in which both of the boundary conditions are chemically patterned surfaces. Examples of chemically patterned surfaces include patterned polymer brushes or mats, chemically patterned self-assembled monolayers, and patterned resists. The chemically patterned surfaces each typically have at least one dimension within an order of magnitude of a domain of the block copolymer material, such that it can drive the assembly of the block copolymer material. The chemical patterns can differ in one or more of orientation, length scale and pattern geometry. In some embodiments, the chemically patterned surfaces are arranged in a precise orientation or registration with respect to each other.

The methods can involve depositing the block copolymer material on one of the two condensed phase surfaces to form a thin block copolymer film, then covering the block copolymer film with other of the condensed phase surfaces. Covering the block copolymer film can involve conformal deposition of the surface on the block copolymer film. In some embodiments, a surface can be deposited on a carrier substrate and then brought into contact with the surface of the block copolymer film. In some embodiments, an unsupported polymer film can be brought into contact with the surface of the block copolymer film.

In some embodiments, the methods can be used to form block copolymer thin films having thicknesses of between about 1 micron and 5 microns. Thinner films may also be formed. In some embodiments, the block copolymer materials can relatively high interaction parameters. The block copolymer materials can also be used for block copolymer materials having different surface energies. Another aspect relates to structures, morphologies, and templates formed in the domain structure of block copolymer materials.

Additional aspects relate to structures, morphologies, and templates formed in the domain structure of block copolymer materials assembled between two condensed phase surfaces.

DETAILED DESCRIPTION

1. Introduction

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Provided herein are novel methods of directing the assembly of block copolymer thin films. In some aspects, the methods involve assembly thin films sandwiching the films between two condensed phase surfaces. According to various embodiments, one surface (e.g., the bottom surface) is a chemically patterned substrate that directs the assembly of the block copolymer films. A second (top) surface can be homogenous or patterned.

Advantages according to certain embodiments include directed assembly of vertically oriented structures using block copolymers with sub-10 nm domains and large differences in surface energy between blocks that could not be assembled previously. The block copolymers can have high etch selectivity. Assembly of these types of polymers can be useful for lithographic applications in the semiconductor industry, information storage, and fabricating nanoimprint templates. Advantages also can include directed assembly of thick films with precise control over three-dimensional structures for membrane and separations applications, templates for energy harvesting applications, plasmonics, and photonics. The structures may have gradients in characteristic dimensions, or non-regular feature shapes.

Figure 1:
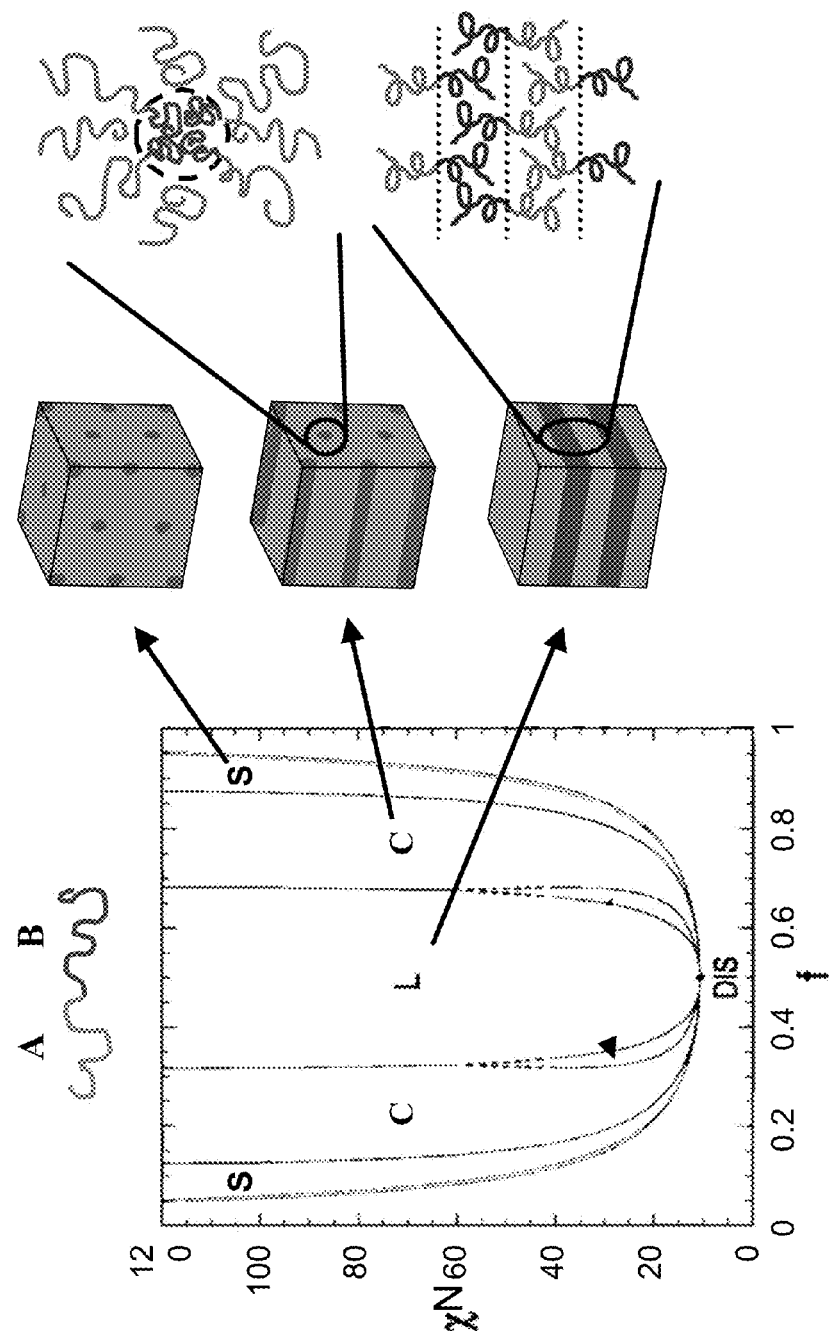
FIG. 1 shows ideal phase behavior of diblock copolymers.

Self-assembling materials spontaneously form structures at length scales of interest in nanotechnology. In the particular case of block copolymers, the thermodynamic driving forces for self-assembly are small and low-energy defects can get easily trapped. Block copolymers are a class of polymers that have two or more polymeric blocks. The structure of diblock copolymer AB, also denoted A-b-B, may correspond, for example, to AAAAAAA-BBBBBBBB. FIG. 1 shows theoretical phase behavior of diblock copolymers. The graph in FIG. 1 shows, $\chi N$ (where $\chi$ is the Flory-Huggins interaction parameter and N is the degree of polymerization) as a function of the volume fraction, f, of a block (A) in a diblock (A-b-B) copolymer. $\chi N$ is related to the energy of mixing the blocks in a diblock copolymer and is inversely proportional to temperature. FIG. 1 shows that at a particular temperature and volume fraction of A, the diblock copolymers microphase separate into domains of different morphological features. As indicated in FIG. 1, when the volume fraction of either block is around 0.1, the block copolymer will microphase separate into spherical domains (S), where one block of the copolymer surrounds spheres of the other block. As the volume fraction of either block nears around 0.2-0.3, the blocks separate to form a hexagonal array of cylinders (C), where one block of the copolymer surrounds cylinders of the other block. And when the volume fractions of the blocks are approximately equal, lamellar domains (L) or alternating stripes of the blocks are formed. Representations of the cylindrical and lamellar domains at a molecular level are also shown. Domain size typically ranges from 2 nm or 3 nm to 50 nm. The phase behavior of block copolymers containing more than two types of blocks (e.g. A-b-B-b-C), also results in microphase separation into different domains. The size and shape of the domains in the bulk depend on the overall degree of polymerization N, the repeat unit length a, the volume fraction f of one of the components f, and, to a lesser extent, the Flory-Huggins interaction parameter, $\chi$.

Figure 2:
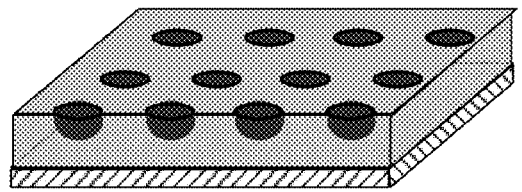
FIG. 2 shows spherical, cylindrical and lamellar ordered copolymer domains formed on substrates.
Figure 2:
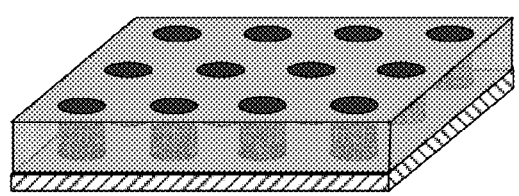
Figure 2:
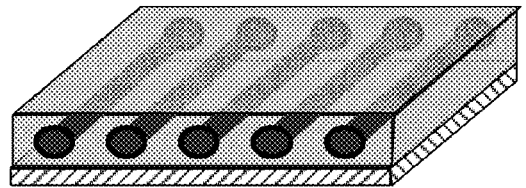
Figure 2:
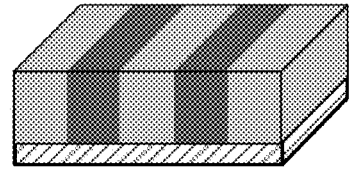

FIG. 2 shows spherical, cylindrical and lamellar ordered domains formed on substrates. Domains (spheres, cylinders or lamellae) of one block of the copolymer are surrounded by the other block copolymer. As shown in FIG. 2, cylinders may form parallel or perpendicular to the substrate. While the FIGS. 1 and 2 show phase behavior of diblock copolymers for illustrative purposes, the phase behavior of block copolymers containing more than two types of blocks (e.g., A-b-B-b-C) also results in microphase separation into different architectures.

A block copolymer material may be characterized by bulk lattice constant or period $L_o$. For example, a lamellar block copolymer film has a bulk lamellar period or repeat unit, $L_o$. For cylindrical and spherical domain structures, the periodicity of the bulk domain structures can be characterized by the distance between the cylinders or spheres, e.g., in a hexagonal array. Periodic patterns formed on substrates or in thin block copolymer films may also be characterized by characteristic lengths. "L" is used herein to denote a characteristic length or spacing in a pattern. It may be referred to as a lattice constant, pitch, period or length. For example, a lamellar period $L_s$ of a two-phase lamellar substrate pattern may be the width of two stripes. $L_s$ is used herein to denote the period, pitch, lattice constant or other characteristic length of a substrate pattern.

Surface energy, as used herein, refers to energy at the surface between a condensed and non-condensed phase, such as a solid block copolymer thin film or block copolymer film in the melt and a gas or vacuum. Interfacial energy, as used herein, refers to energy at the surface between two condensed phases, such as a solid block copolymer thin film or block copolymer thin film in the melt and a liquid or solid.

As indicated above, methods of fabricating block copolymers thin films that involve directing the assembly of block copolymer materials sandwiched between two condensed phases are described herein. According to various embodiments, one surface of the two surfaces can be chemically patterned such that the block copolymer material self-assembles in accordance with the chemical pattern. For the purposes of discussion, this surface may be referred to as the "bottom surface" in this discussion, though it is not necessarily on bottom during assembly or thereafter. According to various embodiments, the other of the two surfaces can be homogenous or patterned. For the purposes of discussion, this surface may be referred to as the "top surface," though it is not necessarily on top during assembly or thereafter. The bottom surface may be referred to as a surface of a substrate and the top surface may be referred to as a surface of a superstrate.

2. Chemically Patterned/Chemically Homogenous Surfaces

Figure 3:
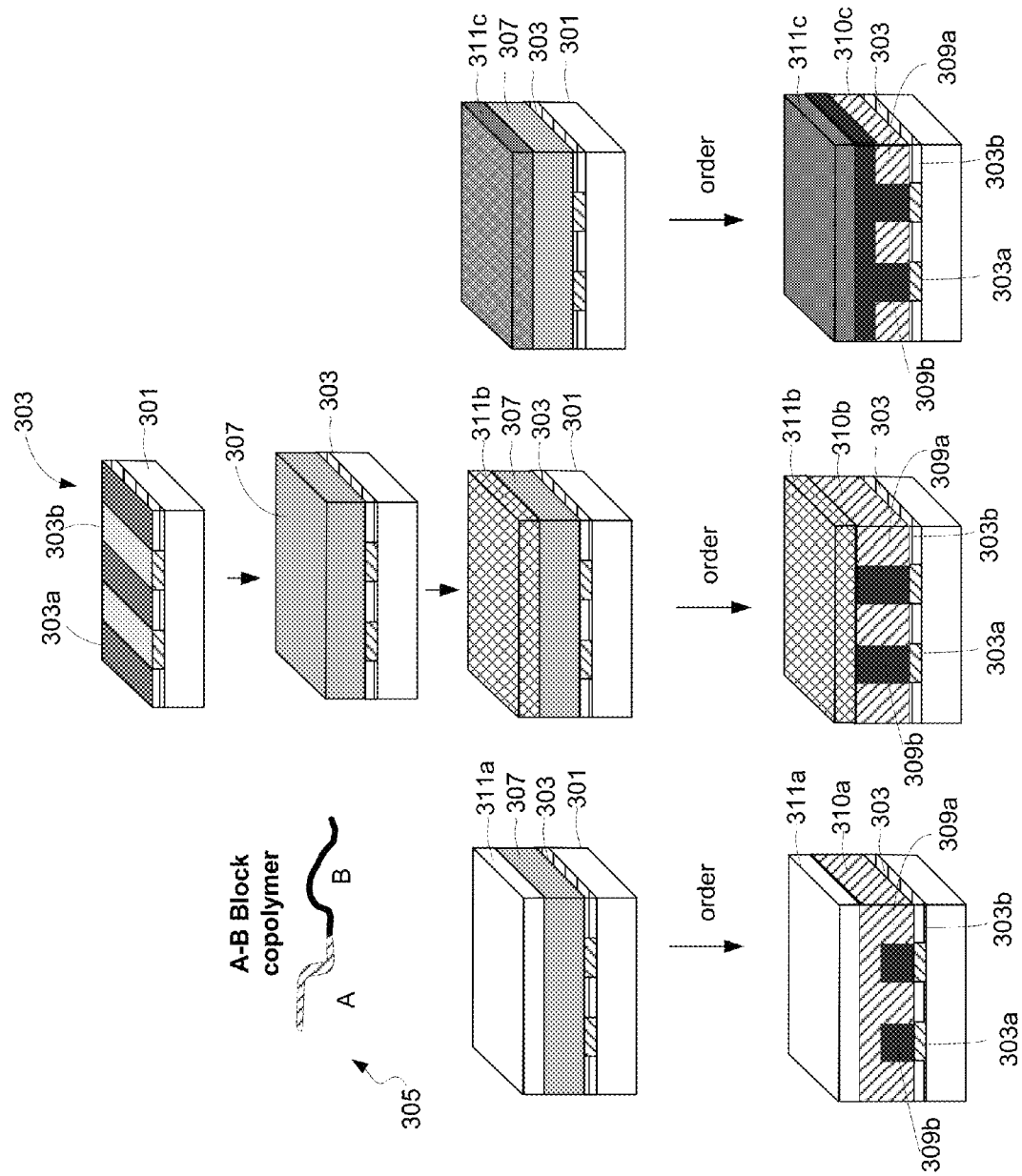
FIG. 3 is a schematic diagram showing operations in methods of directing forming a block copolymer thin film structure between a chemically pattern surface and a chemically homogenous surface according to certain embodiments.

FIG. 3 is a schematic diagram showing operations in methods of directing forming a block copolymer thin film structure using homogeneous top surfaces according to certain embodiments. FIG. 3 shows a patterned substrate 301 on which a block copolymer material is to be deposited. The substrate is patterned with a chemical pattern 303 that can direct the self-assembly of the block copolymer material. In the example of FIG. 3, chemical pattern 303 is patterned with regions 303a and 303b, forming a striped pattern. Any appropriate patterning technique and pattern that can direct the assembly of a block copolymer material can be used, with examples described further below. In general, the substrate is patterned with regions preferential to one or more blocks of the copolymer material. In the example of FIG. 3, the block copolymer material 307 includes an A-B block copolymer 305, with regions 303a of chemical pattern 303 preferential to the A-block of the A-B block copolymer 305 and/or regions 303b of chemical pattern 303 preferential to the B-block of the block copolymer 305. The block copolymer material 307 is spun on or otherwise deposited on the chemical pattern 303, forming a thin film of material on the chemical pattern 303. Any appropriate block copolymer material can be used, with examples described further below.

A surface 311 is placed into contact with the exposed surfaces of the block copolymer material 307, such that block copolymer material 307 is sandwiched between bottom and top surfaces, the chemical pattern 303 being the bottom surface and the surface 311 being the top surface. FIG. 3 depicts three types of different surfaces 311a, 311b and 311c that can be used as a top surface in certain embodiments. Each of surfaces 311a, 311b and 311c is a homogenous surface. Surface 311a is preferential to the A-block of the A-B block copolymer 305; surface 311b is non-preferential with respect to the A and B blocks of the A-B block copolymer 305 and surface 311c is preferential to the B-block of the A-B block copolymer 305. Accordingly, surface 311a is preferentially wet by the A-block; surface 311c is preferentially wet by the B-block, and surface 311b is wet by both A- and B-blocks. For example, surface 311a can be composed of A homopolymers, surface 311c of B homopolymers and surface 311b of random copolymers of A molecules and B molecules. These surfaces are not necessarily strictly uniform; for example, a surface of random copolymers can have a number of different compositions of random polymers. The interfacial energy between each surface and the block copolymer material 307 is substantially the same across that surface. As described further below, the surfaces 311a-311c can be put into contact with the block copolymer material 307 by a variety of methods including by use of a carrier substrate, placing a mat of surface material on the block copolymer material, or by a spin-on or vapor deposition process on the block copolymer material. After sandwiching the block copolymer material 307 between the chemical pattern 303 and top surface 311, the block copolymer material 307 is ordered to form microphase-separated domains. Any method of ordering a block copolymer material may be used including thermal anneal above a glass transition temperature of component blocks. FIG. 3 shows examples of assembled block copolymer films 310a-310c. Each of block copolymer films 310a-310c includes perpendicularly-oriented domains 309a and 309b that are registered with the underlying chemical pattern 303.

The block copolymer film 310a assembled between chemical pattern 303 and surface 311a includes domains 309a and 309b registered with pattern regions 303a and 303b, respectively, at the bottom surface. In the example shown, surface 311a is preferential to A block, and the assembled film 310a includes a region of A at the top surface 311a. The block copolymer film 310b assembled between chemical pattern 303 and non-preferential surface 311b includes domains 309a and 309b registered with pattern regions 303a and 303b, respectively, at the bottom surface. Perpendicular domains 309a and 309b extend through the thickness of the film 310b. The block copolymer film 310c assembled between chemical pattern 303 and B-preferential surface 311c includes domains 309a and 309b registered with pattern regions 303a and 303b, respectively, at the bottom surface. In the example shown, the assembled film 310b includes a region of B at the top surface 311c. The presence or thickness of a top wetting layer such as the layer of A in the film 310a or the layer of B in the film 310c can vary according to the particular block copolymer film and top surface.

In some embodiments, the pattern formed by the perpendicularly-oriented domains 309a and 309b shown in FIG. 3 can be transferred, for example to the underlying substrate 301, or to another substrate. In some embodiments, a top or bottom surface can be removed prior to pattern transfer. In some embodiments in which a film assembles between a patterned surface and a preferential surface (such as films 310a and 310c), the top layers of A or B can be removed as well. Various modifications to the process shown schematically in FIG. 3 can be made. For example, in some embodiments, a block copolymer material can be first deposited on a homogeneous surface, with a patterned surface then added to form a homogenous surface—block copolymer material—chemically patterned surface sandwich.

Sandwiching a film between two condensed-phase materials as described above eliminates a free surface (e.g., air or vacuum) at the top surface of the block copolymer film. Surface energy driven interactions at the free surface of the film are material properties that have a tremendous impact on the assembly of the film, but are difficult or impossible to control or manipulate. Once a block copolymer system is chosen, the surface energy aspects of directed assembly are fixed. The methods described herein allow the interactions that dominate assembly at all boundaries to be specified and manipulated so as to have significantly better control over the three-dimensional structure of the film.

In some embodiments, the use of a homogeneous substrate allows block copolymer materials having interaction parameters ($\chi$) greater than that of PS-PMMA to be used. The interaction parameter $\chi$ is temperature-dependent; accordingly block copolymer materials having $\chi$'s greater than that of PS-PMMA at the temperature of assembly can be used in certain embodiments. Domain size is inversely correlated with $\chi$; block copolymers with a large $\chi$ assemble into smaller domains. In methods in which block copolymer thin films has a free surface, perpendicular orientation of block copolymer domains in thin films have been limited by constraints imposed by surface energy between each block of the block copolymer material and the free surface. In particular, block copolymers with large $\chi$ may have a significant difference in surface energy between the two blocks, $\Delta\gamma$. Even a moderate $\Delta\gamma$ will result in the block with lower $\gamma$ preferentially covering the free surface, thereby eliminating at the free surface any pattern formed within the block copolymer film. In some embodiments, a chemically patterned substrate directs the formation of ordered domains perpendicular to the substrate, with the presence of a condensed phase superstrate permitting the morphology to propagate to the top surface of the film.

Various modifications can be made to operations or order of operations in FIG. 3. For example, a block copolymer material can be first deposited on a chemically homogenous surface. In another example, a block copolymer material can undergo a first assembly prior to being covered by a second surface, after which it undergo a second assembly in the presence of two condensed surfaces.

3. Two Chemically Patterned Surfaces

Also provided are methods that involve confining a block copolymer material by two patterned surfaces when directing the assembly of the material, as well as related structures. In some embodiments, complex three-dimensional structures may be achieved from directed assembly of block copolymer materials, including diblock copolymers, due to the interplay between the entropic penalty due the one-dimensional confinement and the energetic contributions of both patterns attempting to induce, locally, a specific symmetry.

The directed self-assembly from both top and bottom surfaces offers precise surface property control for block copolymers that have a significant surface energy difference between the two blocks and it can avoid the formation of undesired structures at the surface for lithographic applications. In some embodiments, the formation of a complex interface results in bicontinuous block copolymer domains through the entire film. In some embodiments, the structures have continuous physical properties such as continuous conductivity, diffusivity, etc. which are desirable for technological applications. Examples are photovoltaic devices where exitons use continuous conduction to the electrodes during their short lifetimes so that they do not diminish at the interfaces and energy storage devices such as batteries where electricity carriers use continuous diffusivity towards the electrodes.

Figure 4A:
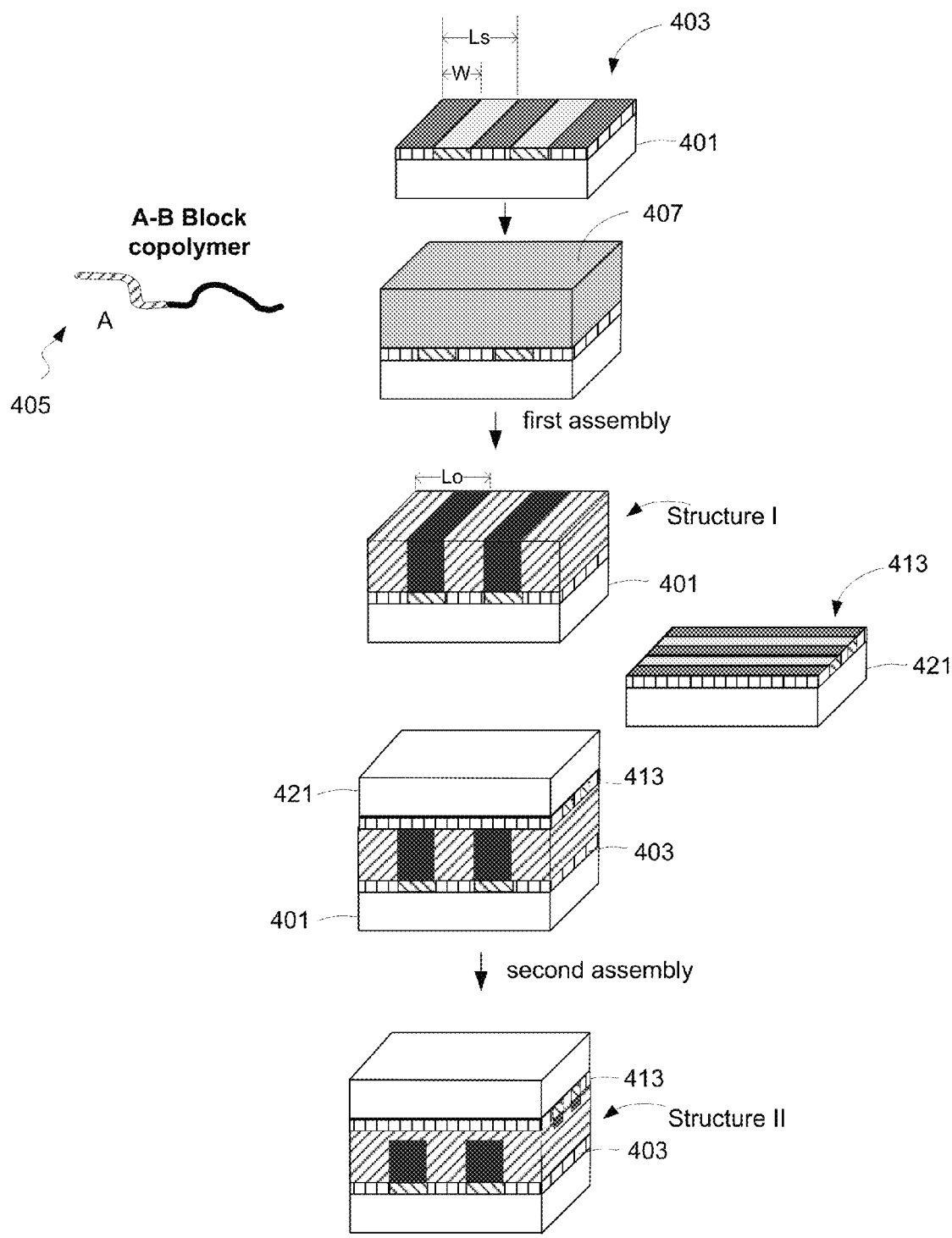
FIGS. 4a and 4b are schematic diagrams showing operations in methods of directing forming a block copolymer thin film structure between two chemically patterned surfaces according to certain embodiments.
Figure 4B:
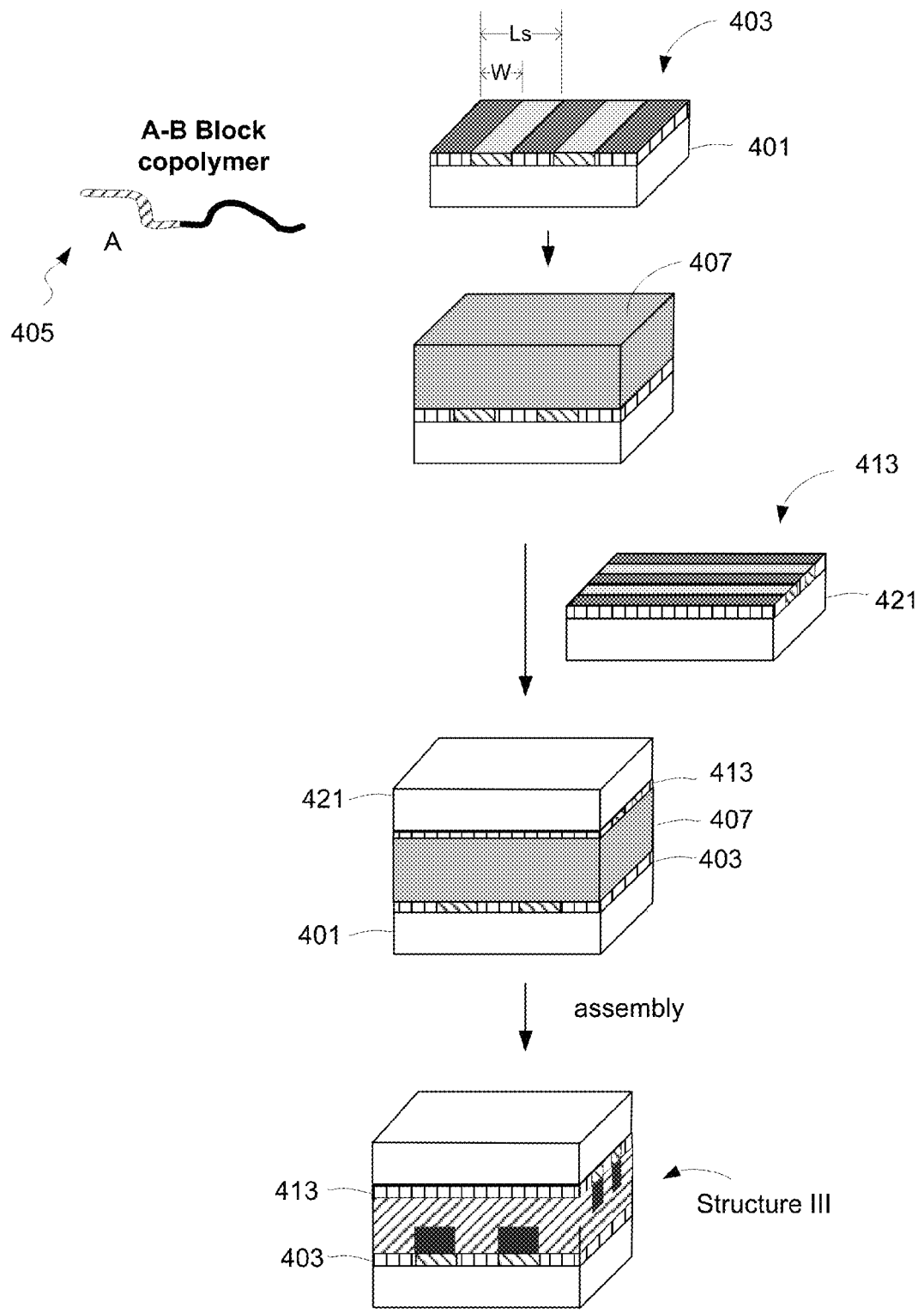

FIGS. 4a and 4b are schematic diagrams showing operations in methods of directing forming a block copolymer thin film structure between two chemically patterned surfaces according to certain embodiments. Both FIGS. 4a and 4b show a patterned substrate 401 on which a block copolymer blend film is to be deposited. The substrate 401 is patterned with a first chemical pattern 403 that can direct the self-assembly of a block copolymer material. As in the example of FIG. 3, the first chemical pattern 403 is patterned with periodic stripes having width W and a period of Ls.

A block copolymer material 407 includes an A-B block copolymer 405, with alternating stripes wet by different blocks of the A-B block copolymer, as described above with respect to FIG. 3. The block copolymer material 407 is spun on or otherwise deposited on the chemical pattern 403, forming a thin film of material on the first chemical pattern 403. Any appropriate block copolymer material can be used, with examples described further below. The block copolymer material 407 has a free surface. In the schematic of FIG. 4a, the block copolymer material 407 is directed to assemble, forming structure I on the substrate 401. After this assembly, the structure I is covered with a second chemical pattern 413. In the example shown, the second chemical pattern 413 is depicted on a substrate 421; in other embodiments, the second chemical pattern may be free of a support. The second chemical pattern 413 is the same pattern of stripes of width W and period Ls as is the first chemical pattern 403; the second chemical pattern 413 is oriented such that its stripes are orthogonal to those of the first chemical pattern 403. The block copolymer material is then re-annealed in the presence of the second chemical pattern 413, to form structure II. Turning again to FIG. 4b, the block copolymer film 407 is covered with the second chemical pattern 413 prior to being assembled. Sandwiched between the first chemical pattern 403 and the second chemical pattern 413, the block copolymer film is assembled, forming structure III.

Structures I, II and III represent equilibrium morphologies of block copolymer thin films. When only one chemically patterned surface is present, the block copolymers form lamellae morphology perpendicular to the substrate 401 in registration with the patterned stripes of the first chemical pattern 403, such that the lamellae are aligned with the stripes (Structure I). Between two chemically patterned surfaces, the block copolymers form more complex morphologies at equilibrium. Further discussion of the morphologies formed is below.

In some embodiments, the first and second patterns can have the same pattern geometry and length scale and be aligned such that the features of the second pattern are aligned with those of the first pattern. In such configurations, the resulting morphology may be uniform throughout the thickness of the film, replicating the aligned patterns throughout. In some embodiments, the first and second patterns can have the same pattern and length scale, but have translationally off-set features. In some embodiments, the first and second patterns can have the same pattern geometry and length scale, but be oriented at different angles. For example, the chemical patterns 403 and 413 in FIGS. 4a and 4b are at 90° angles to each other. In some embodiments, the first and second patterns can differ in one or more of pattern geometry and length scale. For example, one pattern can have a striped geometry with the other having a hexagonal array of spots. In another example, one pattern can have a period of Lo with the other pattern having a period of 2Lo. The patterns can be chosen according to the desired equilibrium geometries.

4. Parameters

The following are examples of substrates, patterning techniques, patterns, top surfaces and block copolymer materials that may be used in accordance with certain embodiments.

Substrate

Any type of substrate may be used. In semiconductor applications, wherein the block copolymer film is to be used as a resist mask for further processing, substrates such as silicon or gallium arsenide may be used. For patterned media applications, a master pattern for patterned media may be made on almost any substrate material, e.g., silicon, quartz, or glass.

According to various embodiments, the substrate may be provided with a thin film or imaging layer thereon. The imaging layer may be made of any type of material that can be patterned or selectively activated. In a certain embodiment, the imaging layer comprises a polymer brush or a self-assembled monolayer. Examples of self-assembled monolayers include self-assembled monolayers of silane or siloxane compounds, such as self-assembled monolayer of octadecyltrichlorosilane.

In certain embodiments, the imaging layer or thin film to be patterned is a polymer brush layer. In certain embodiments, the polymer brush may include one or more homopolymers or copolymers of the monomers that make up the block copolymer material. For example, a polymer brush of at least one of styrene and methyl methylacrylate may be used where the block copolymer material is PS-b-PMMA. One example of a polymer brush to be used in a thin film is PSOH.

Patterning a Substrate

Substrates may be patterned by any method, including all chemical, topographical, optical, electrical, mechanical patterning and all other methods of selectively activating a substrate. A chemically patterned surface can include, for example, patterned polymer brushes or mats, including copolymers, mixtures of different copolymers, homopolymers, mixtures of different homopolymers, block oligomers, and mixtures of different block oligomers. In embodiments where a substrate is provided with an imaging layer (such as a self-assembled monolayer or polymer brush layer) patterning the substrate may comprise patterning the imaging layer. Alternatively, a substrate may be patterned by selectively applying the pattern material to the substrate. In some embodiments, a resist can be patterned using an appropriate method. The substrate patterning may comprise top-down patterning (e.g. lithography), bottom-up assembly (e.g. block copolymer self-assembly), or a combination of top-down and bottom-up techniques. In certain embodiments, the substrate is patterned with x-ray lithography, extreme ultraviolet (EUV) lithography or electron beam lithography. In certain embodiments, a chemically patterned surface can be prepared using a molecular transfer printing method as disclosed in US Patent Publication 2009/0260750, incorporated by reference herein.

Substrate Pattern

Top and/or bottom surface patterns (as well as the block copolymer material used) affect self-assembled domains that result from the processes described above. The surface pattern(s) and the block copolymer film deposited on it are chosen to achieve the desired pattern in the block copolymer film. In certain embodiments, there is a 1:1 correspondence between the number of features patterned on the substrate (by e-beam lithography or other technique) and the number of features in the self-assembled block copolymer film. In other embodiments, there may be a 1:2, 1:4 or other correspondence, with the density of the substrate pattern multiplied as described in US Patent Publication 2009/0196488. It should be noted that in certain cases, the 1:1 correspondence (or 1:2, etc.) might not be exactly 1:1 but about 1:1, e.g., due to imperfections in the substrate pattern. The directed assembly may or may not be epitaxial according to various embodiments. That is, in certain embodiments, the features as defined by the block copolymer domains in the block copolymer film are located directly above the features in the chemical contrast pattern on the substrate. In other embodiments, however, the growth of the block copolymer film is not epitaxial. In these cases, the chemical contrast (or other substrate pattern) may be offset from the self-assembled domains.

In certain embodiments, the pattern corresponds to the geometry of the bulk copolymer material. For example, hexagonal arrays of cylinders are observed bulk morphologies of certain PS-b-PMMA and other block copolymers. However, in other embodiments, the substrate pattern and the bulk copolymer material do not share the same geometry. For example, a block copolymer film having domains of square arrays of cylinders may be assembled using a material that displays hexagonal arrays of cylinders in the bulk.

The individual features patterned on the substrate may be smaller than or larger than the mean feature size of the block copolymer domains (or the desired feature size). In certain embodiments, the $L_s$ of the substrate pattern is about $+/-0.1L_o$. In some embodiments, a pattern may have a different length scale Ls than the bulk morphology, as discussed in Example 5, below. Examples include 1.5Lo or 2.0Lo. In certain embodiments, the pattern has at least one dimension within an order of magnitude of a dimension of one domain in the block copolymer material.

Block Copolymer Material

The block copolymer material includes a block copolymer. The block copolymer can include any number of distinct block polymers (i.e. diblock copolymers, triblock copolymers, etc.). A specific example is the diblock copolymer PS-b-PMMA. Any type of copolymer that undergoes microphase separation under appropriate thermodynamic conditions may be used. This includes block copolymers that have as components glassy polymers such as PS and PMMA, which have relatively high glass transition temperatures, as well as more elastomeric polymers. Other examples of block copolymers include poly(styrene-b-ethylene oxide) (PS-b-PEO), poly(styrene-b-dimethylsiloxane) (PS-PDMS), and poly(styrene-b-2-vinylpyridine) (PS-b-P2VP).

The block copolymer material may include one or more additional block copolymers. In some embodiments, the material may be a block copolymer/block copolymer blend. An example of a block copolymer/block copolymer blend is PS-b-PMMA (50 kg/mol)/PS-b-PMMA (100 kg/mol).

In some embodiments, the block copolymer materials have interaction parameters ($\chi$) greater than that of PS-PMMA. The interaction parameter $\chi$ is temperature-dependent; accordingly block copolymer materials having $\chi$'s greater than that of PS-PMMA at the temperature of assembly can be used in certain embodiments. In some embodiments, block copolymers having sub-10 nm domains in the bulk used.

The block copolymer material may also include one or more homopolymers. In some embodiments, the material may be a block copolymer/homopolymer blend or a block copolymer/homopolymer/homopolymer blend, such as a PS-b-PMMA/PS/PMMA blend.

The block copolymer material may comprise any swellable material. Examples of swellable materials include volatile and non-volatile solvents, plasticizers and supercritical fluids. In some embodiments, the block copolymer material contains nanoparticles dispersed throughout the material. The nanoparticles may be selectively removed.

Second Surface

In the examples described above, a block copolymer material is directed to assemble between a chemically patterned surface and a second or top surface. The top surface may be chemically homogenous or patterned. Chemically homogenous surfaces can illicit non-preferential wetting behavior or balanced interfacial interactions with two or more blocks of the copolymer material, or can be weakly or strongly preferential to one or more components of the block copolymer material. In some embodiments, a surface preferential to one component can include homopolymers of that component. In some embodiments, a surface can include random copolymers.

The top surface can be conformally deposited on the block copolymer material using a conformal deposition technique such as spin-on deposition, chemical vapor deposition, or atomic layer deposition. The top surface can be formed on a second substrate and brought into contact with the block copolymer material. For example, a polymer brush layer or mat can be deposited on a substrate. In some embodiments, an unsupported polymer film can be placed on the block copolymer material.

5. Experimental and Simulation

Example 1—Directed Assembly Between Chemically Patterned and Chemically Homogenous Surfaces Materials Symmetric PS-b-PMMA (52 kg/mol PS, 52 kg/mol PMMA and PDI=1.04), symmetric PS-b-P2VP (40 kg/mol PS, 40 kg/mol P2VP, $L_0 \approx 53$ nm, PDI=1.07), hydroxyl-terminated P2VP (P2VP-OH, 6.2 kg/mol, PDI=1.05) and P2VP (106 kg/mol, PDI=1.07) were acquired from Polymer Source, Inc., and used as received. PMMA photoresist was purchased from MicroChem Corp. and had a $M_n$ of 950 kg/mol. Hydroxyl-terminated PS (PS-OH, $M_n$=6.0 kg/mol, PDI=1.07) was synthesized using anionic polymerization and hydroxyl-terminated P(S-ran-MMA) ($M_n$=6.2~6.8 kg/mol, PDI=1.20~1.25) was synthesized by nitoxide-mediated living free radical polymerization (NMP). Crosslinking PS, crosslinking P(S-ran-MMA) and crosslinking PMMA brushes (xPS, xSranMMA and xPMMA) were synthesized. The fraction of crosslinking agent in the crosslinking brushes was about 4% and the fractions of styrene monomer in the xPS, xSranMMA and xPMMA were about 96%, 63% and 0%, respectively.

Patterning for PS-b-PMMA Assembly

A 20 nm film of PS-OH was spin coated onto a piranha treated silicon wafer substrate from a 1.0 wt. % toluene solution. The substrate was then annealed under vacuum at ~160° C. for 2 days to graft, via a dehydration reaction, the PS-OH to the Si substrate. Ungrafted PS-OH was then extracted using repeated sonications in warm toluene for greater than 10 minutes total.

A 50-nm-thick film of poly(methyl methacrylate) photoresist (PMMA, 950 kg mol-1) was spin coated, from a chlorobenzene solution, on top of the PS brush substrates and baked at 160° C. for 60 s. The patterning procedure used extreme-ultraviolet interference lithography (EUV-IL). All samples were developed for 30 s in a 1:3 solution of methyl isobutyl ketone:isopropyl alcohol (IPA), followed by IPA rinsing and drying. The photoresist pattern was subsequently transferred to a chemical pattern in the PS brush by oxygen plasma etching at 8 mTorr $O_2$ and a power of 100 mW for 10 s. The remaining resist was rinsed away with chlorobenzene.

Patterning for PS-b-P2VP Assembly

Chemically patterned surfaces for PS-b-P2VP assembly were prepared by molecular transfer printing. P(S-r-MMA)-OH was grafted onto a silicon wafer substrate in an analogous method to the previously mentioned PS-OH surface. The P(S-r-MMA) brush surface acts as non-preferential surface to PS-b-PMMA. A greater than 200 nm thick 90 wt % PS-b-PMMA/10 wt % PS-OH blend film was spin coated on the P(S-r-MMA) brush surface and annealed at 230° C. for 1 day to generate a fingerprint structure on the top surface of the film. Following fingerprint formation about 35 nm of $SiO_2$ was vapor deposited on the surface of the assembled film. An oxygen-plasma-cleaned silicon substrate was then placed in contact with the vapor deposited $SiO_2$ surface. The sandwiched structure was clamped by a parallel four screw clamp, annealed at 160° C. for 24 h under vacuum, and separated by dissolving block copolymers and unreacted homopolymers by immersion in chlorobenzene for 24 h followed by repeated sonication in chlorobenzene (five 5 min cycles) to create a mirror plane replica of the original fingerprint. Transfer of PS-OH brush to the replica surface occurred only at the region in contact, and the area of contact is limited by the planarity of master and replica substrates. Then, a greater than 200 nm thick film of 91 wt % PS-b-P2VP/9 wt % P2VP-OH was spin coated onto the PS grafted substrate from a 5.0 wt. % DMF solution and annealed at 170° C. for 48 h under vacuum. Ungrafted P2VP-OH was then extracted using repeated sonications in DMF (five 5 min cycles). The resulting MTP transferred and filled PS/P2VP brush surface with fingerprint structure acted as a chemically patterned surface for the assembly of PS-b-P2VP.

Silicon Membrane Preparation

Preparation of the silicon membrane started from Silicon on Insulator (SOI) wafer (Wafer Bond Inc.) which has a 200 nm silicon top layer and 3 μm buried oxide (BOX). The SOI wafer was first patterned into arrays of 7×7 μm2 holes with 50 μm gaps, using optical lithography. The holes were etched down to the BOX layer using reactive ion etching. The sample was immersed into 10% HF solution for 7 h and dipped into DI water, then, the silicon membrane floated onto the DI water surface. Subsequently, the silicon membrane was placed into Piranha solution to remove the photoresist and to generate a silicon oxide layer on surface. The Si membrane was rinsed with DI water and kept in DI water.

A 100 nm thick polymer film of 80 wt % P2VP/20 wt % P2VP-OH blend was spin coated on Si substrate. The Si membrane was gently picked up by the polymer film. The sample was then annealed at 160° C. for 24 h for grafting P2VP-OH on the membrane. The Si membrane was then transferred onto another Si wafer by sandwiched membrane with another Si wafer and soaking in chlorobenzene for overnight. After transfer, a Si membrane sitting on Si wafer with P2VP-OH grafted side upward was obtained. This grafted Si membrane was gently rinsed with chlorobenzene and dried with nitrogen before it was transferred onto PS-b-P2VP thin film.

Chemically Homogenous Surface Preparation and Thin Film Assembly

PS-b-PMMA was spin coated from a 1.5% toluene solution onto the chemically patterned surface, resulting in a 50-nm-thick film. Separately, 40-nm-thick films of xPS, xSranMMA, and xPMMA were spin coated on top of thick silicon oxide (about 100 nm) deposited silicon wafer from 1.5% toluene solution and baked at 190° C. for 24 h to crosslink the materials. The crosslinked mats were then floated on a 10% hydrofluoric acid (HF) solution by etching away the silicon oxide in the HF, and then transferred to cover the prepared PS-b-PMMA thin film on the chemical pattern. The sandwiched PS-b-PMMA thin films were annealed under vacuum at 230° C. for 12 h to achieve their equilibrium morphology.

A 125 nm thick PS-b-P2VP film was deposited onto the MTP transferred and filled PS/P2VP brush surface and covered by xPS mat and P2VP grafted silicon membrane. The sample was then annealed at 160° C. for 1 days for assembly of PS-b-P2VP between the MTP chemical pattern and the PVP grafted silicon membrane.

Results

Figure 5:
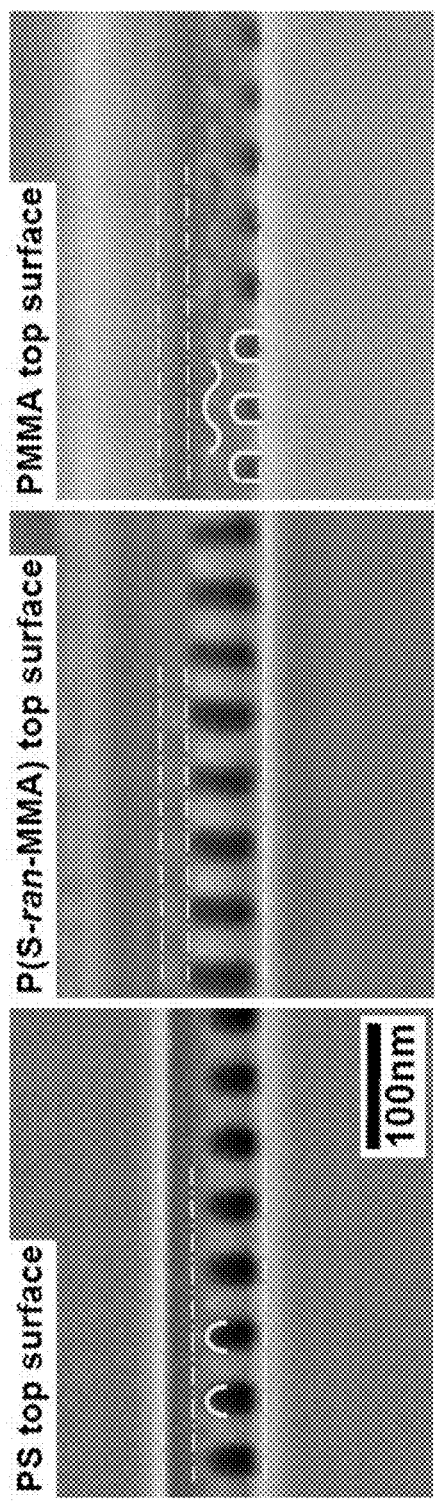
FIG. 5 depicts cross-sectional SEM images of 50 nm thick PS-b-PMMA films on chemical patterns with crosslinked PS, P(S-ran-MMA), and PMMA top surfaces.

FIG. 5 show cross-sectional SEM images of 50 nm thick PS-b-PMMA film on chemical pattern with crosslinked PS, P(S-ran-MMA), and PMMA top surface. The top surfaces are identified in the images with dashed lines on the top of the PS-b-PMMA films. The bright regions in the images are matched for PS and the dark regions for PMMA. The PS-b-PMMA is perfectly registered on the underlying chemical pattern at the bottom of the films. However, the top of the PS-b-PMMA films with different top interactions show distinct morphologies for each sample. Non-preferential top surface with P(S-ran-MMA) resulted in the PS-b-PMMA film orienting perpendicularly from to bottom to the top of the film. With the PS-preferential wetting top surface, most of the PS-b-PMMA is oriented perpendicularly except the very top layer of the film, with the top wetting layer being PS. In contrast, below the PMMA-preferential top surface, PS-b-PMMA is oriented parallel with just the bottom of the film having perpendicularly-oriented domains that are registered with the chemical pattern.

Figure 6:
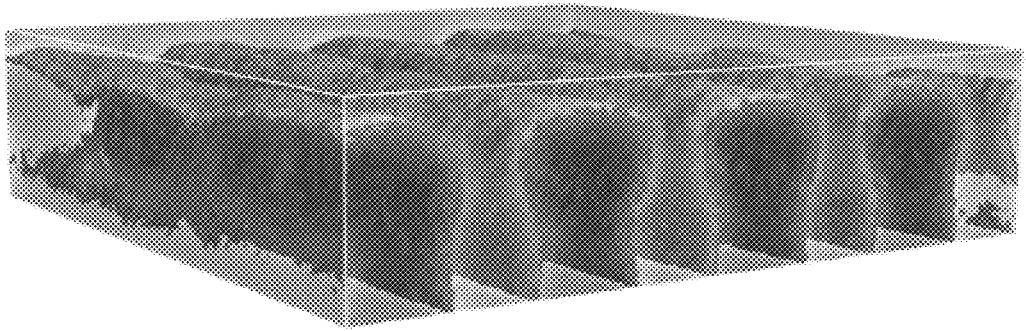
FIG. 6 depicts three dimensional simulation results of PS-b-PMMA thin films on a chemical pattern with PS preferential, non-preferential and PMMA preferential top surfaces.
Figure 6:
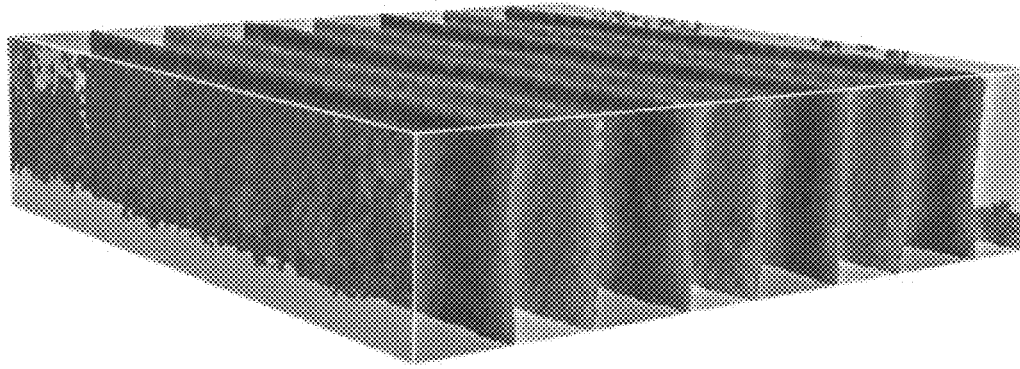
Figure 6:
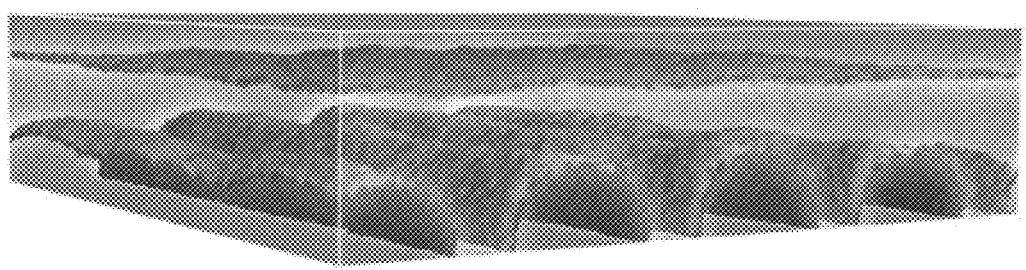

Example 2—Directed Assembly Between Chemically Patterned and Chemically Homogenous Surfaces Monte Carlo simulations of a symmetric A-B diblock copolymer corresponding to PS-b-PMMA $M_n$=about 104 kg/mol and $\chi N$=37 were performed. A and B represent PMMA and PS, respectively. The pattern on the bottom surface had stripes of width W repeated with a period Ls=Lo, the width fixed at W=Lo/2. The areas between these stripes are referred to as "background," such that the pattern includes alternating stripe/background/stripe/background regions. The interactions between the blocks (A or B) with the patterned surface are specified by four parameters: $\Lambda_{(A-stripe)}$, $\Lambda_{(A-background)}$, $\Lambda_{(B-stripe)}$, and $\Lambda_{(B-background)}$. For simplicity it was assumed that for striped and background areas, the attraction for the preferred block is equal in magnitude to the repulsion for the nonpreferred block, i.e., $\Lambda_{(A-stripe)}N=-\Lambda_{(B-stripe)}N=\Lambda_{stripe}$ and $\Lambda_{(A-background)}N=\Lambda_{(B-background)}N=\Lambda_{background}$. For these parameters there is a strong attraction for the A block on the stripes and a weak attraction for the B block on the background areas, specifically, $\Lambda_{stripe}$=2 and $\Lambda_{background}$=0.2. For the homogeneous top surface $\Lambda_{(A-top)}=-\Lambda_{(B-top)}=\Lambda_{top}$ was used. To investigate the influence of the cross-linked top layer on the morphologies assembled, the value of $\Lambda_{top}$ was varied from strongly preferential for the A block to strongly preferential for the B block. FIG. 6 shows the 3D morphologies obtained by simulations for three cases: (I) $\Lambda_{top}$=-1, (II) $\Lambda_{top}$=0 and $\Lambda_{top}$=1, which represent the PS cross-linked, neutral and PMMA cross-linked top layers, respectively. The results agree with the experimental results: non-preferential top surface with P(S-ran-MMA) resulted in the PS-b-PMMA film orienting perpendicularly from to bottom to the top of the film. With the PS-preferential wetting top surface, most of the PS-b-PMMA is oriented perpendicularly except the very top layer of the film, with the top wetting layer being PS. In contrast, below the PMMA-preferential top surface, PS-b-PMMA is oriented parallel with just the bottom of the film having perpendicularly-oriented domains that are registered with the chemical pattern.

Example 3—Directed Assembly Between Two Chemically Patterned Surfaces

Using lithography and an oxygen plasma, a PS brush on a silicon wafer was converted to chemical patterns with alternating stripes of PS brush and oxygen-plasma-treated PS brush, which preferentially wet PS and PMMA blocks of polystyrene-block-poly(methyl methacrylate) (PS-b-PMMA), respectively. The period of the chemical patterns (Ls=76 nm) was commensurate with that of PS-b-PMMA (molecular weight, Mn=85-91 kg/mol, bulk lamellae period, Lo=75.8 nm). All stripes had the same width (W of 38 nm). By annealing at 230° 0 for 3 days under vacuum, the block copolymers could self-assemble into periodic lamellae with domains in registration with the chemical patterns. Three processes, resulting in structures I, II, and III such as those shown in FIGS. 4a and 4b, were performed. All films had the same thickness of 2Lo. The angle between the stripes on the bottom- and top-substrate was manually aligned to be about 90°. After assembly, the top-substrate was removed before characterization.

Figure 7:
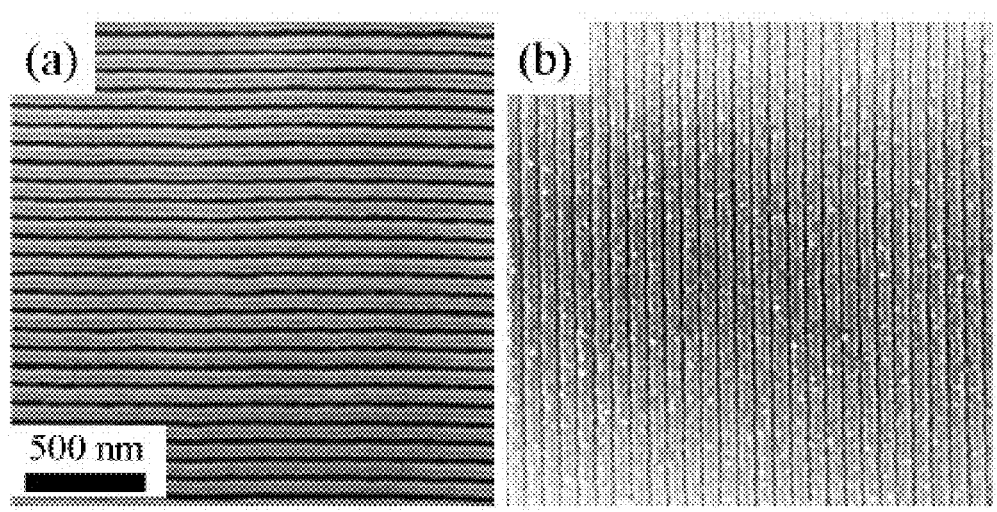
FIG. 7 depicts top down SEM images of (a) structure I fabricated by directed assembly in the presence of one chemical pattern and a free surface and (b) structure II fabricated by annealing structure I in the presence of a second chemical pattern.
Figure 8:
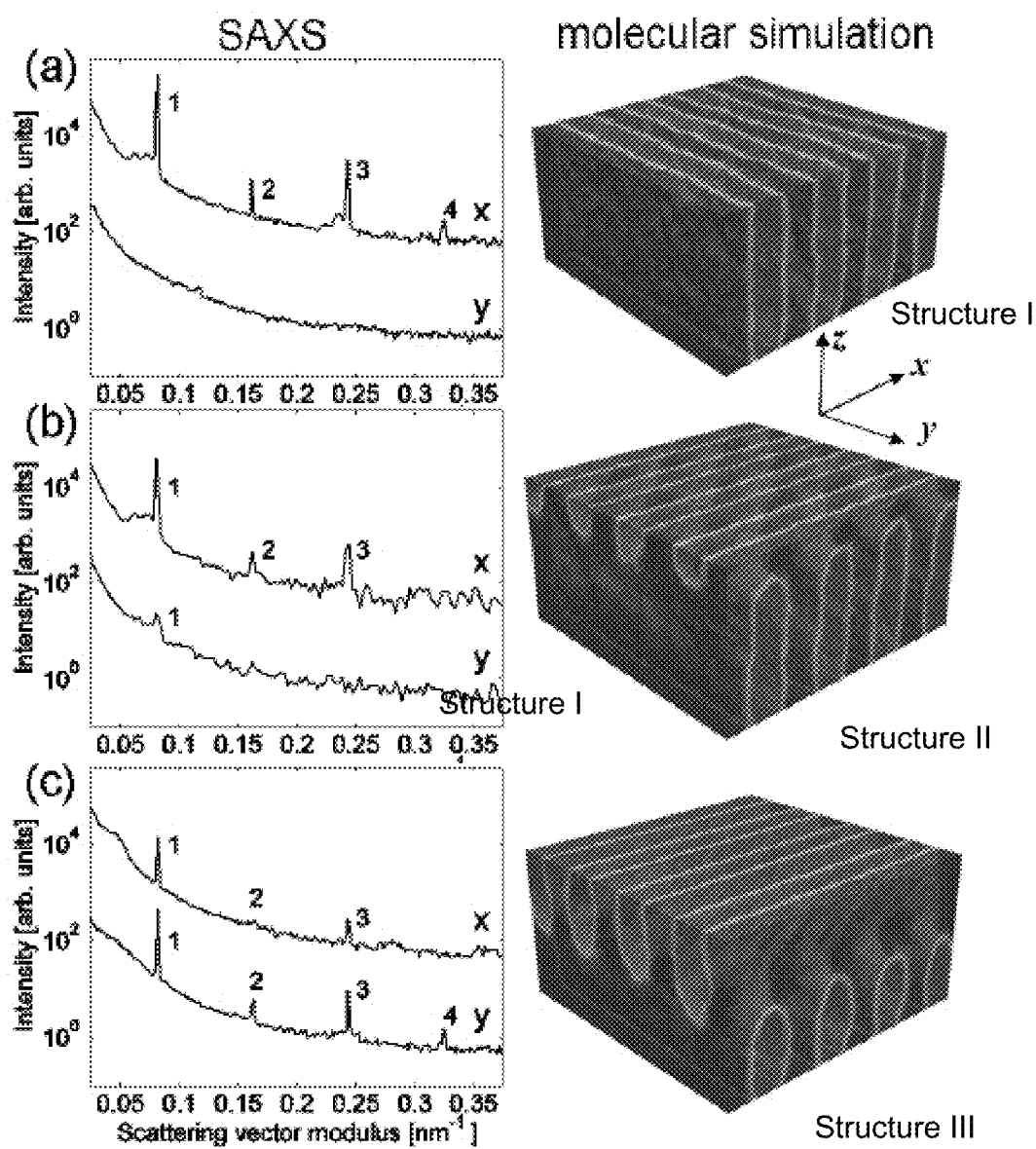
FIG. 8 depicts spectra of SAXS in transmission mode along the x and y directions and the molecular simulated 3D views of (a) structure I, (b) structure II, and (c) structure III.

The top-down SEM images of structure I and II are shown in panel (a) and panel (b), respectively, of FIG. 7. After the assembly on one chemically patterned surface, the block copolymers formed lamellae in registration with the underlying chemical pattern (panel (a)). This pre-assembled film was then sandwiched with another chemically patterned surface. As can be seen in the top-down SEM image, the domains that ran originally in one direction are now organized in the orthogonal direction (panel (b)). The block copolymer near the top surface re-assembled in response to the top chemical pattern during the second annealing step. Alignment marks were made on the sample to ensure that the images were taken in the same angle. The block copolymer domains at the top surface rotated an angle of approximately 87° to register with the top chemical pattern. The top-down view of structure III (not shown) was similar to that of structure II. In this case, the film is not pre-assembled and the domains assemble from a disordered state. Due to the probe depth of electrons, the top-down SEM gives real-space information of the block copolymer domains only near the free surface. SAXS, however, probes the entire film of block copolymer and gives volume-averaged reciprocal-space information to determine the morphology inside the film. The scattering measurement in transmission mode could detect the lamellar domains that were perpendicular to the substrate. For structure I, scattering peaks up to the fourth order were observed along the x-direction (directions shown in FIG. 8), and the odd-order peaks were more apparent than those even-order ones as shown in panel (a) of FIG. 8. The scattering peaks indicated that the block copolymer formed perpendicular lamellae with a period of 76 nm in registration with the chemical pattern on the surface. For structure II, two sets of scattering peaks appeared on the x-y plane of the SAXS pattern, indicating the coexistence of the block copolymer lamellar domains perpendicular to the plane of the film along the two directions (panel (b) of FIG. 8). The angle between the x and y directions was 87°, as measured from the SAXS pattern, which was in agreement with the rotation angle measured from the SEM images. In comparison with the scattering pattern in panel (a) the appearance of the second set of scattering peaks in panel (b) was a result of the re-assembly during the second annealing step, indicating that the block copolymer domains near the top surface re-assembled to align with the chemical pattern on the top substrate. The scattering intensities of the peaks along the y-direction were not as strong as those along the x-direction, indicating that the volume fraction of the lamellae oriented along the y-direction was smaller than that along the x-direction. Based on the intensity of the scattering peaks along the two directions, approximately 17% of the entire film rearranged to register with the chemical pattern parallel to the y-direction during the second annealing step. For structure III, two sets of scattering peaks with approximately the same intensities were observed along the x- and y-direction (panel (c) of FIG. 8). The roughly equal scattering intensities of the peaks along the two directions indicated that the lamellar domains near the top and the bottom substrate had roughly equal volume fraction and they met in the middle of the film. Estimated from the scattering measurement, for this particular sample, 63% of the film had lamellae domains oriented in the y-direction. Monte Carlo simulations of an A-B diblock copolymer ($\chi N=63$) corresponding to the diblock PS-PMMA polymer used in Example 3 were performed. FIG. 8 also shows 3D morphologies obtained from Monte Carlo simulations of structure I, II, and III. The 3D morphologies revealed the formation of single lamellae morphology on one chemical pattern and a complex structure between two chemical patterns. The complex structure included lamellar domains, replicating the patterns, continuously connected by an interface characterized by an array of saddle points located in a plane, whose localization depends on the process, in agreement with SAXS measurements. The formation and localization of the interface can be explained by the minimization of free energy in the system. By localization, it is meant the position of the plane were the saddle points defining the interface are located. Starting with a disordered state on one chemical pattern, the block copolymer equilibrates at lamellae in registration with the underlying chemical pattern (Structure I). Starting with a disordered state followed by an intermediate state in which lamellae are placed between two chemical patterns, the bottom part of the block copolymer film remains, but the top part re-assembles in response to the chemical pattern on the top substrate (Structure II). Without being bound by a particular theory, it is believed that once the annealed block copolymer lamellae are exposed to a chemical pattern on the top substrate, the increased block-surface interfacial energy initiates the directed self-assembly of the block copolymers near the top surface. The lamellar domains re-arrange so that they are in registration with the corresponding wetting stripes to minimize the surface energy. The range of interactions between the chemical pattern and block copolymer is a few nanometers. The reorganization of more material according to the top pattern requires collective distortion of the bottom lamellae, thus once the influence of the pattern decays, the interface connecting the domains forms. The entropy penalty of the block copolymer chains being near the surface and the energetic requirement to satisfy the boundary conditions of the chemical patterns compete with the chain frustration induced by the non-flat regions of the interface. The balance of these competing elements induces the formation of the interface far from the surface. But as long as the interface is far enough from the surface, it can be localized anywhere inside the film. The lack of thermodynamic driving force results in the localization of the interface near the top surface.

In Monte Carlo (MC) simulations, even after $10^5$ MC steps, no shift of the interface towards the middle of the film was observed, indicating that the morphology is stable. When the block copolymer self-assembly is directed by two chemical patterns from a disordered state, the top and bottom patterns induce the formation of lamellae domains at approximately the same rate, thus the interface forms in the middle of the film (Structure III in FIG. 8). Although the boundary conditions are the same at the end of both processes to obtain Structures II and III, the resulting block copolymer structures are different due to the presence of an intermediate state in the process to form Structure II. Nevertheless, both structures have the same free energy. In general, the nucleation rate of each pattern could be different and the interface can be localized anywhere inside the film as long as it is far enough form the surfaces.

Figure 9:
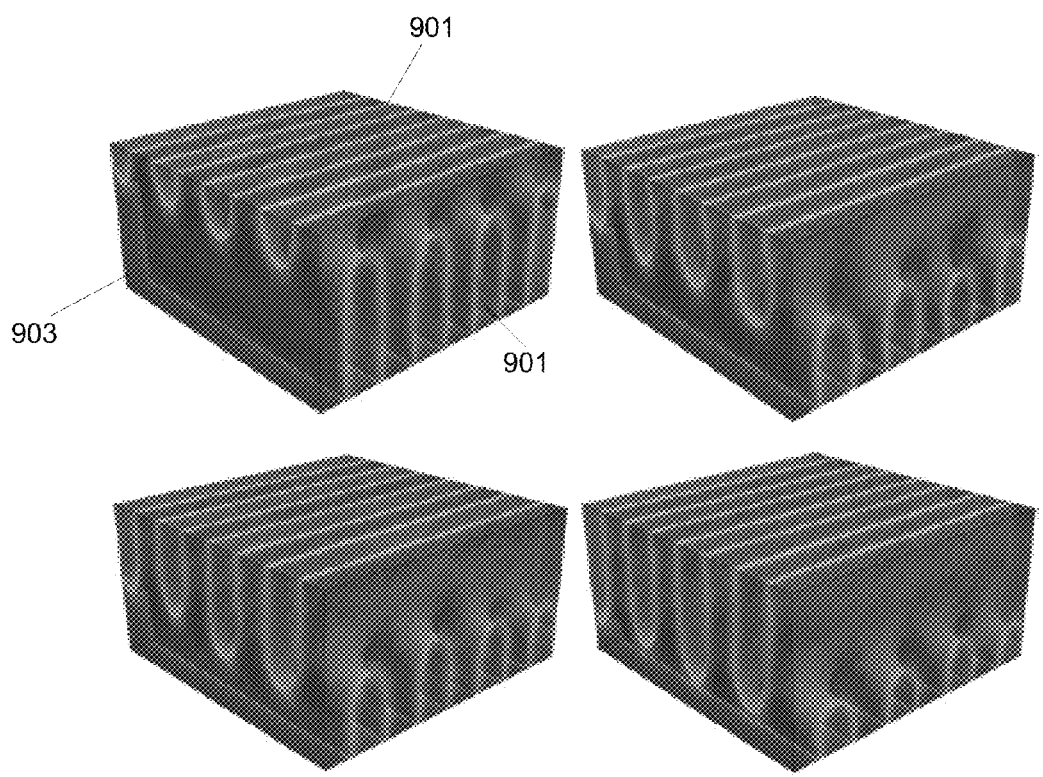
FIG. 9 depicts three-dimensional morphologies of block copolymers between two chemical patterns obtained from Monte Carlo simulations.

Three-dimensional morphologies were generated from MC simulations using different initial disordered state configurations. FIG. 9 depicts examples of different morphologies. The patterned stripes on the top and bottom chemical patterns are orthogonal to each other. The initial configurations were different disordered states; in the final state the localization of the interface is different. For reference, B-rich domains 901 and A-rich domains 903 are indicated. This interface resembles the interface predicted at grain boundaries between two lamellar grains of different orientations in the bulk. In the depicted case, however, the structure and the associated interface corresponded to a bona fide thermodynamic equilibrium. The simulations show that the formation of the interface between domains resulted in a bicontinuous and double-periodic structure.

Example 4—Directed Assembly of Films of Varying Thicknesses Between Two Chemically Patterned Surfaces Monte Carlo simulations were used explore the effect of other parameters, such as film thickness, on the equilibrium morphology. In this work, the patterns on both surfaces include repeated stripes of width W and period Ls. The areas between the stripes are referred to as background as in Example 2. Due to the simple geometry of the patterns, the interactions between the blocks (A or B) with the patterned surfaces are specified by four parameters: $\Lambda_{(A-stripe)}$, $\Lambda_{(A-background)}$, $\Lambda_{(B-stripe)}$, and $\Lambda_{(B-background)}$.

In general, there will be eight parameters (four parameters associated to each surface) describing both chemical patterns, but for simplicity it is assumed that both surfaces have the same characteristics, thus only four parameters are used. Also, it is assumed that for striped and background areas, the attraction for the preferred block is equal in magnitude to the repulsion for the nonpreferred block, i.e. $\Lambda_{(A-stripe)}N=-\Lambda_{(B-stripe)}N=\Lambda_{stripe}$ and $\Lambda_{(A-background)}N=-\Lambda_{(B-background)}N=\Lambda_{background}$. In this work, the stripes have preference for the block A ($\Lambda_{stripe}>0$) and the background for the block B ($\Lambda_{background}>0$).

For thick films, the influence of the patterned surfaces may not be the dominant factor. The lamellae grains can grow in any orientation inside the film and induce irregular structures. Another important parameter is the affinity of the pattern to the blocks of the block copolymers. In addition, the width of the patterned stripes can also play an important role in determining the possible morphologies. For the case of patterns with exactly the same geometric properties as the lamellae morphology in the bulk, it was found that the background affinity has little influence on the morphologies. Although MC simulations do not give dynamical information, it was found that for stronger affinities, it was faster (in terms of MC steps) to attain equilibrium. The effect of the background affinity is limited at low affinity values where a slightly asymmetry between two contiguous domains occur, resulting in a lamellae grain with one domain slightly larger than the other one.

Figure 10:
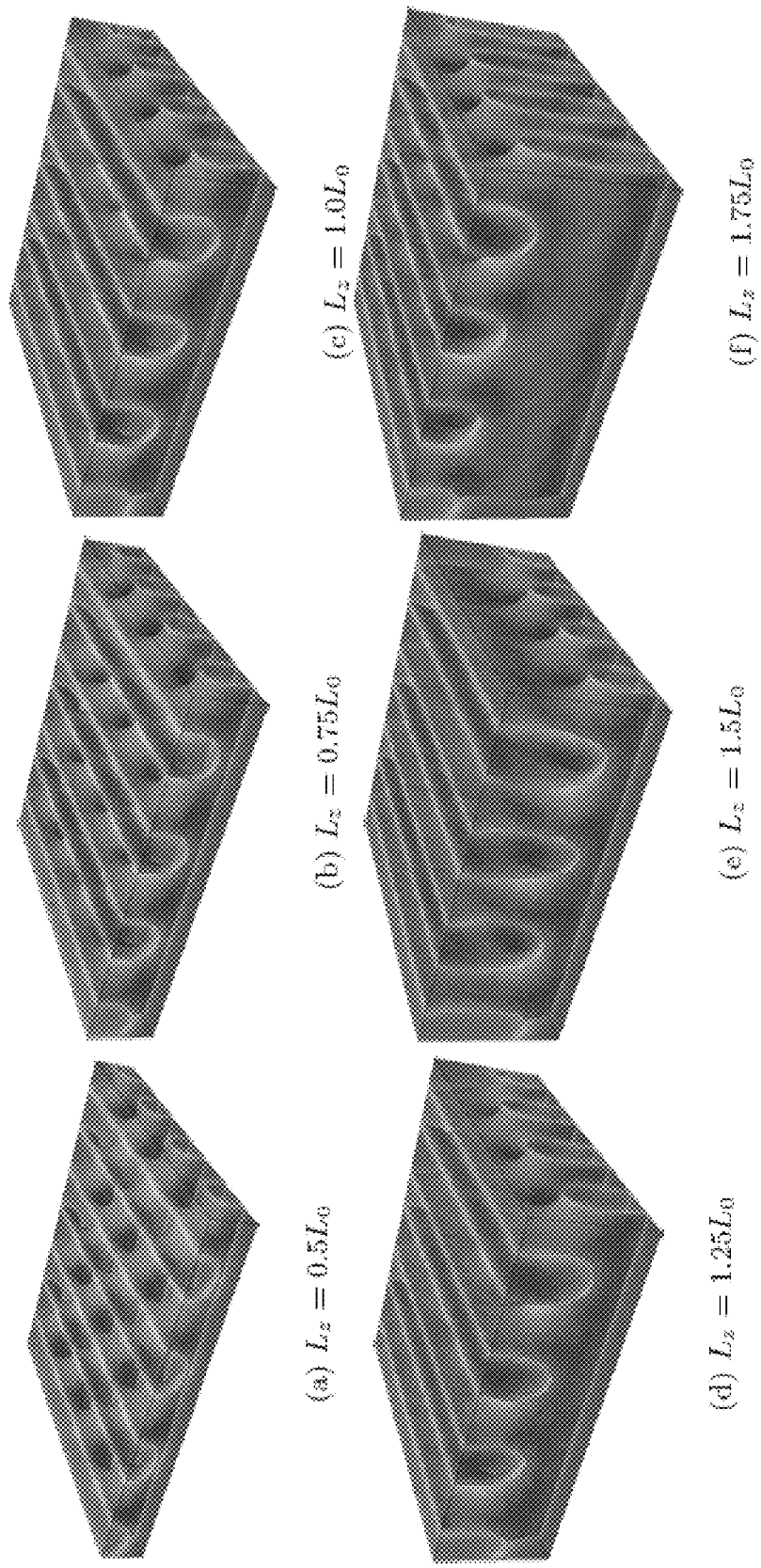
FIG. 10 depicts three-dimensional morphologies of block copolymers between two chemical patterns with Ls=Lo, W=0.5Lo, $\Lambda_{background}$=0.2, and $\Lambda_{stripe}$=2.0 for various film thicknesses, Lz, obtained from Monte Carlo simulations.

In contrast, it was found that the film thickness has a significant effect on the final morphology for the values explored (going from Lz=0.5Lo to Lz=2.0Lo). The final morphology had two grains meeting in the twist grain boundary (TGB), whose localization had a strong dependence on the thickness. Here TGB localization means the thin layer position were all the saddle points are located. Three-dimensional morphologies of block copolymers between two chemical patterns with Ls=Lo, W (stripe width)=0.5 Lo, $\Lambda_{stripe}$=2 and an intermediate value of $\Lambda_{background}$=0.4 for various film thicknesses, Lz, obtained from Monte Carlo simulations are shown in FIG. 10. The delocalization of the twist grain boundary of the middle of the film for thicknesses larger than 1.0 Lo can be seen. For smaller values of Lz, it can be said that all samples are basically a single interface spanning all the film. For thicker films, the kinetics have an important role in the localization of the TGB: if one pattern starts the nucleation faster than the other one, then the grain induced by the first one is going to be larger than the second one. Thus, the TGB is going to be located near the second surface. But, there exists a minimum distance from the surfaces where the TGB can be localized. While the above discussion uses concepts taken from the bulk description, namely, grains and TGB, it should be noted that the structure and the associated interface corresponds to a thermodynamic equilibrium state, instead of a metastable state as in bulk. For block copolymer thin films in the presence of chemically patterned surfaces, the different contributions to the free energy, the interfacial and bulk-like terms, have comparable magnitudes. Thus, a simple description as bulk morphology perturbed by the patterns is no longer valid. In this case, the equilibrium morphologies arise from interplay between the breaking of translational symmetry, energetic contributions of the pattern attempting to induce, locally, a specific symmetry, the incompatibility between the blocks and the entropic force associated with the chain elasticity. Also, the structural frustration due to the incompatibility between the natural periodicity of the bulk morphology and film thickness can play an important role.

Example 6—Directed Assembly Between Two Chemically Patterned Surfaces

The patterns in the above Examples have the same periodicity as the lamellae morphology of the block copolymer in the bulk. However, by changing the pattern periodicity and geometry the morphologies of block copolymers can be more complex. The symmetry of the local morphologies preferred by the patterns will compete with that of the block copolymer in bulk (e.g., the lamellae). Morphologies formed with Ls=2Lo and, $\Lambda_{stripe}$=2.0 were simulated. At Ls=2 Lo, when one chemically patterned surface is used, a lamellae-forming block copolymer can multiply the feature density of the chemical patterns and interpolate the lamellar domains in the background areas when these regions are slightly attractive to one block of the block copolymer or neutral to both blocks of the block copolymer. Two cases were considered: i) weak $\Lambda_{background}$ (0.2) and ii) strong $\Lambda_{background}$ (2.0). Block copolymer morphologies as a function of W and Lz were explored. The results show that block copolymers equilibrate into complex morphologies that are not present in the bulk.

Example 6A: $\Lambda_{background}$=0.2: Block Copolymers on Background with Weak Interaction Strength The tendency to form perpendicular lamellae competes with the influence of the background to be wet by the block B, trying to form, locally, parallel lamellae when W is small. The film thickness has an important role in defining which influence will dominate: as the thickness increases the influence of the patterns potentials decreases, thus dominating the bulk-like terms, therefore in thicker films it is expected that there exists a tendency to form perpendicular lamellae shaped domains.

Figure 11:
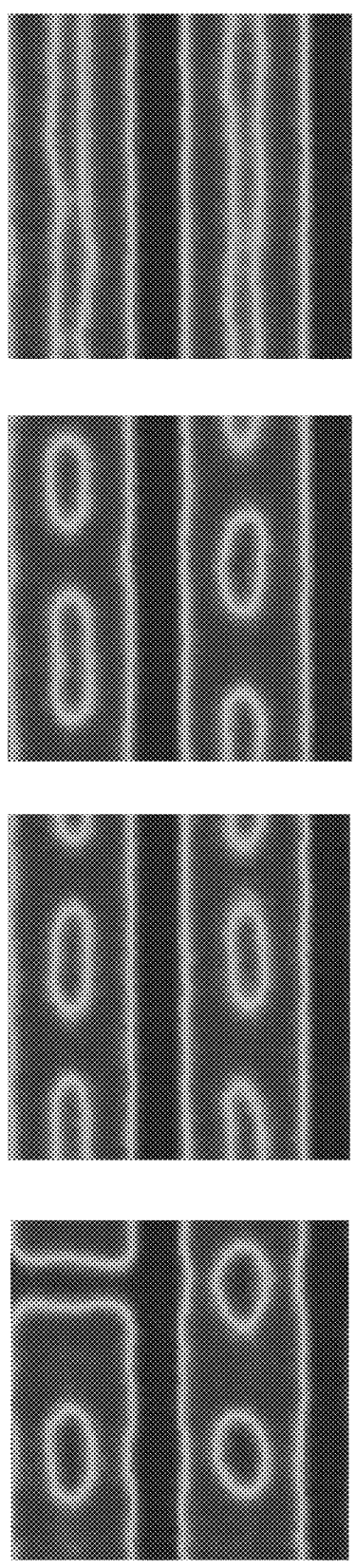
FIG. 11 depicts top-down views and three-dimensional snapshots of block copolymers morphologies between two chemical patterns with Ls=2Lo, W=0.5Lo, $\Lambda_{background}$=0.2, and $\Lambda_{stripe}$=2.0 for various film thicknesses, Lz, obtained from Monte Carlo simulations.
Figure 11:
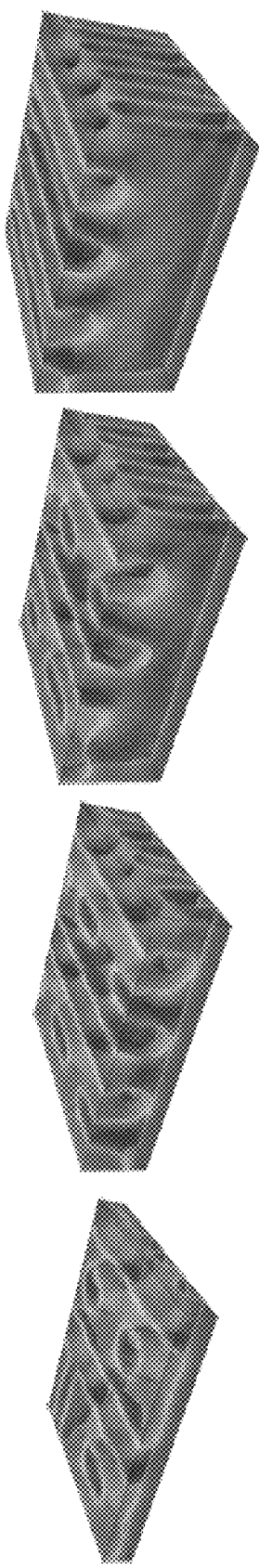

When W=Lo/2, the equilibrium morphologies of block copolymers as a function of the film thickness are shown in FIG. 11. In all cases, the block copolymer morphologies are bicontinuous. For the stronger confinement (Lz=0.5Lo), the block A (darker regions) wets the chemically patterned stripes and forms orthogonal tubular domains with a spacing of 2Lo. These domains are connected with each other in a similar way to how the Scherk's surface connects the two domains. In the background areas, the non-preferred blocks (block A) try to interpolate, but the interpolated regions are limited to small spots that wet the background surface. Occasionally these spots create an orthogonal bridge between two parallel domains. As the thickness increases to Lz=1.0Lo, the interpolating spots start to grow in the background areas and form a dashed line pattern near the surfaces. In other words, the morphologies have alternating continuous lines and dashed lines near the surfaces, as can be seen in the top-down views in the FIG. 11. The lines at the top and bottom surfaces are orthogonal to each other, and they join inside the film in a continuous manner. As the thickness increases further to Lz=1.5Lo, the size of the dashed lines increases. For Lz=2.0Lo, the dashed lines become continuous and the pattern at the surfaces are periodic lines with a period of Lo. The morphology resembles the one found in the case with Ls=Lo.

Figure 12:
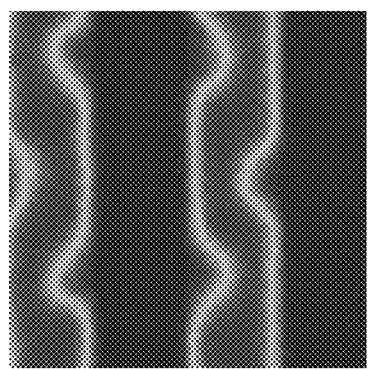
FIG. 12 depicts three-dimensional snapshots of block copolymer morphologies between two chemical patterns with Ls=2Lo, W=Lo, $\Lambda_{background}$=0.2, and $\Lambda_{stripe}$=2.0 for various film thicknesses, Lz, obtained from Monte Carlo simulations.
Figure 12:
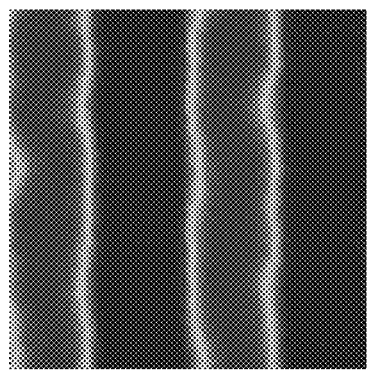
Figure 12:
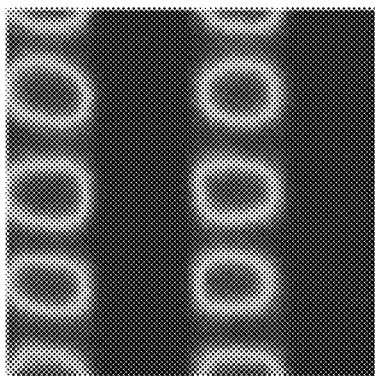
Figure 12:
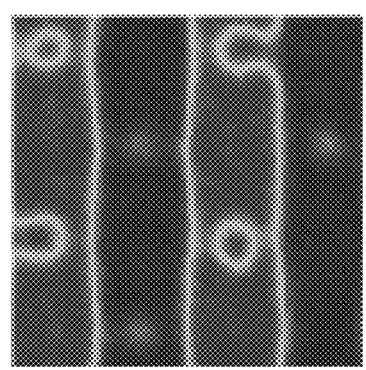
Figure 12:
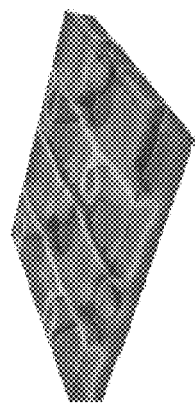
Figure 12:
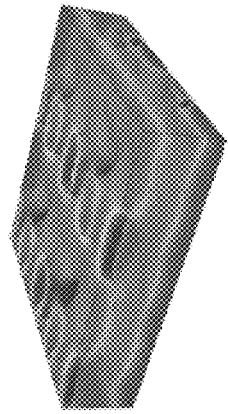
Figure 12:
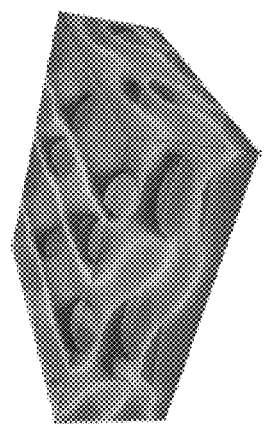
Figure 12:
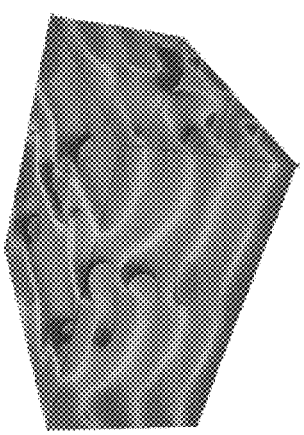

The morphologies of block copolymers as a function of the film thickness on background with weak interaction strength ($\Lambda_{background}$=0.2) and wide chemically patterned stripes (W=Lo) are shown in FIG. 12. Due to the wide chemically patterned stripes, perpendicular lamellae are not consistent with the boundary conditions, and parallel lamellae dominate locally, near the surfaces. For small film thickness, Lz=0.5Lo, the confinement is strong and the block copolymers form an interesting morphology (panel (a) of FIG. 12). To satisfy the local ordering induced by the patterns and to decrease the A-B interfacial area, the block copolymers arrange in the following manner: A and B blocks wet the stripes and background respectively, to form equally spaced, orthogonally-arranged bands near the two surfaces. The bands are joined continuously inside the film. In addition, some small features appear inside the bands: Small ellipsoidal-shapes of blocks B appear in the matrix of A domains. Similarly, small perpendicular cylinders of A blocks appear in the matrix of B domains. However, contrary to the ellipsoidal B domains in the A matrix the cylindrical A domains are not isolated in the B matrix, and they have bridges connecting them to the large A domains.

When the film thickness increases to Lz=1.0Lo, symmetric parallel lamellae is preferred as it is entropically and energetically favorable. Because the weak background affinity for the block B, a linear array of necks of B domains in contact with the background on both surfaces is formed. This disrupts the perfect symmetric parallel lamellae morphology (panel (b) of FIG. 12).

Figure 13:
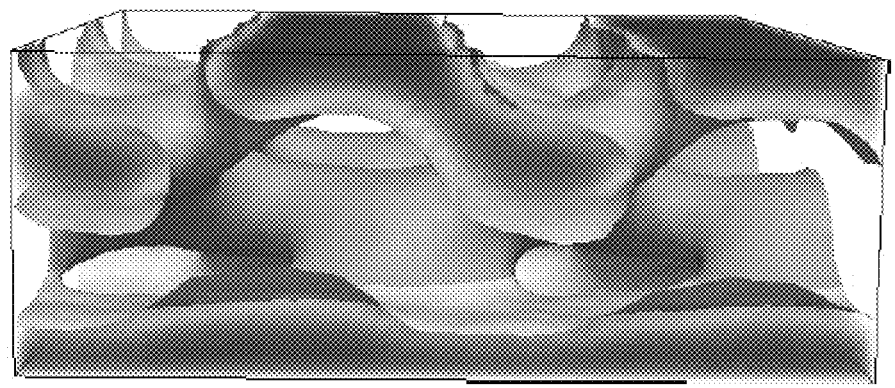
FIG. 13 depicts an interface between the A and B domains of the Lz=1.5Lo morphology depicted in FIG. 12.

For a film thickness of Lz=1.5Lo, the block copolymer morphology is more complex (panel (c) of FIG. 12). The chemically patterned stripes and the background areas induce the formation of orthogonal bands of A domains and B domains. The tendency to form lamellae induces the formation of tubular A regions just above/below the bottom/top background areas. The tubes associated with the bottom surface are orthogonal to those induced by the top surface and they merge in the middle of the film forming a network of connected tubes. They also connect with the bands wetting the stripes, resulting in a global network spanning the entire film. FIG. 13 shows the interface between the A and B domains (light grey surface), with the tubular regions induced by the bottom and top patterns in darker shades. The zigzag shape of the tubes is from when two orthogonal tubes merge, they bend toward the middle of the film.

For the case with Lz=2.0Lo, the larger film thickness permits the domains to become more sheet-like shape, resembling the parallel lamellae morphology (see panel (d) of FIG. 12). These sheet-like domains are merged by bridges to the bands and small tubular domains as in the case Lz=1.5Lo.

Figure 14:
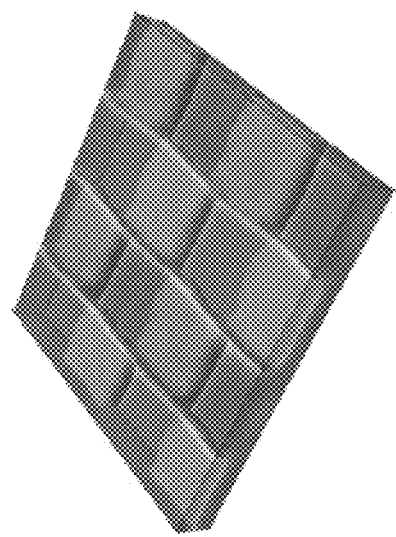
FIG. 14 depicts three-dimensional morphologies of block copolymers between two chemical patterns with Ls=2Lo, W=0.5Lo, $\Lambda_{background}$=2.0, and $\Lambda_{stripe}$=2.0 for various width of stripes, W, obtained from Monte Carlo simulations.
Figure 14:
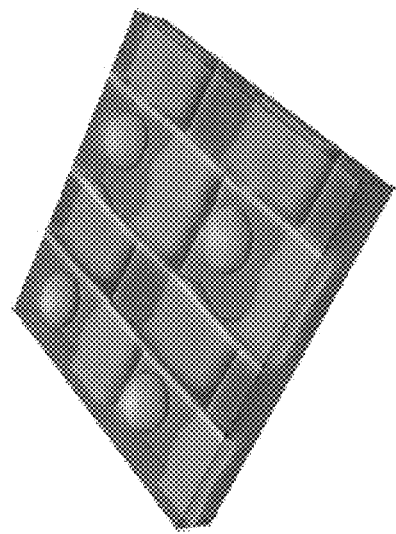
Figure 14:
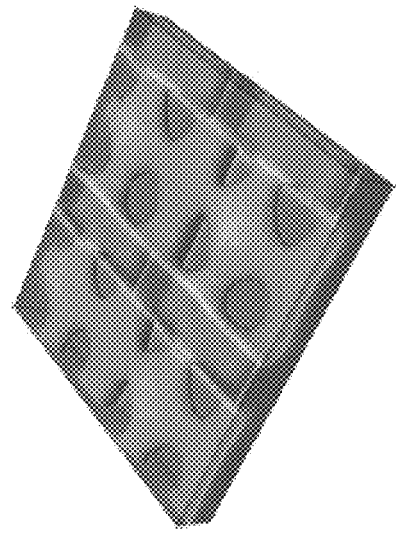

Example 6B: $\Lambda_{background}$=2.0: Block Copolymers on Background with Strong Interaction Strength By increasing the affinity of the background areas to its preferred block ($\Lambda_{background}$=2.0), the interaction strength avoids the wetting of non-preferential blocks and attracts completely the preferential blocks. For small film thickness (Lz=0.5Lo), the morphologies of block copolymers as a function of the width of the chemically patterned stripes are shown in FIG. 14. For W=0.5Lo, small A domains appear immersed in the B domains, these small domains are connected to the large A domains by bridges. As W increases to 0.8Lo, these small domains become isolated and look spherical. The morphology has bicontinuous, orthogonal, and band-like A or B domains and a square array of A spheres in the matrix of B domains. For W=1.0Lo, the spherical domains disappear and the morphology has simple orthogonal bands only.

Figure 15:
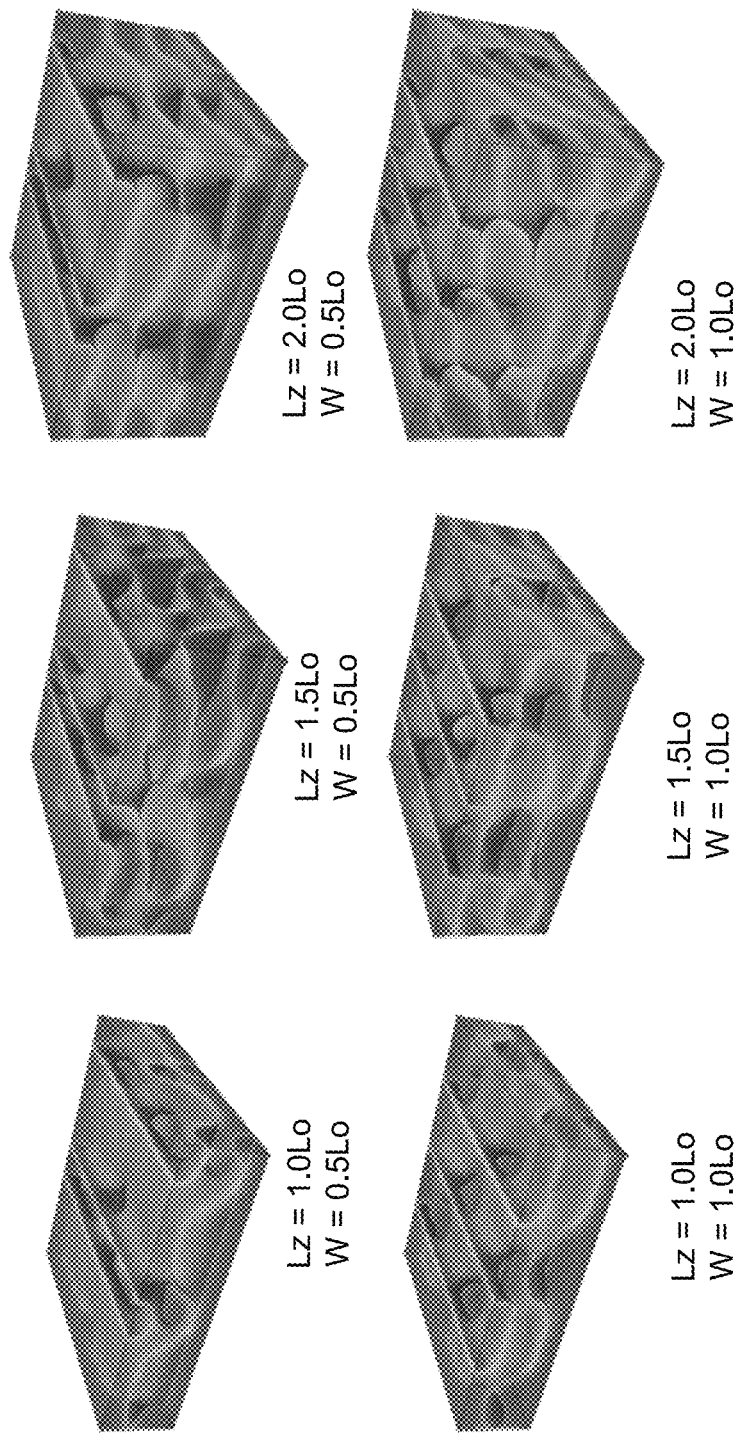
FIG. 15 depicts three-dimensional morphologies of block copolymers between two chemical patterns with Ls=2Lo, W=0.5Lo, $\Lambda_{background}$=0.2, and $\Lambda_{stripe}$=2.0 for various widths of stripes, W, and various film thicknesses, Lz, obtained from Monte Carlo simulations.

For larger film thicknesses, the tendency to form lamellae start to have more influence, particularly when the confinement size is a multiple of the lamellar period in the bulk. FIG. 15 shows the block copolymer morphologies as a function of the film thickness on a background with a strong interaction strength ($\Lambda_{background}$=2.0), and two different widths of chemically patterned stripes, 0.5Lo and 1.0Lo. In this scenario, although the film thickness increases, the overall film structures are very similar: they are networks connecting the full sample.

Although the foregoing invention has been described in some detail for purposes of clarity of understanding, it will be apparent that certain changes and modifications may be practiced within the scope of the invention. It should be noted that there are many alternative ways of implementing both the process and compositions of the present invention. Accordingly, the present embodiments are to be considered as illustrative and not restrictive, and the invention is not to be limited to the details given herein.

The invention claimed is:

1. A method comprising:
    providing a block copolymer material between first and second condensed phase surfaces, wherein the first condensed phase surface is chemically patterned; and
    ordering the block copolymer material to form a thin film including microphase-separated block copolymer domains that correspond to the chemical pattern of the first condensed phase surface.

2. The method of claim 1, wherein the second condensed phase surface is chemically homogenous.

3. The method of claim 2, wherein the second condensed phase surface is a copolymer.

4. The method of claim 1, wherein ordering the block copolymer material comprises preferentially wetting the second surface with one or more blocks of the block copolymer material.

5. The method of claim 1, wherein ordering the block copolymer material comprises non-preferentially wetting the second surface with two or more blocks of the block copolymer material.

6. The method of claim 1, wherein the second condensed phase surface is chemically patterned.

7. The method of claim 6, wherein the chemical pattern of the first condensed phase surface differs from the chemical pattern of the second condensed phase surface in one or more of orientation, length scale, and pattern geometry.

8. The method of claim 6, wherein the chemical pattern of the first condensed phase surface is the same in orientation, length scale, and pattern geometry as the chemical pattern of the second condensed phase surface.

9. The method of claim 1, where providing a block copolymer material between the first and second condensed phase surfaces comprises depositing the block copolymer material on the first condensed phase surface and covering the deposited block copolymer material with the second condensed phase surface.

10. The method of claim 1, wherein the chemical pattern of the first condensed phase surface has at least one dimension within an order of magnitude of a domain of the block copolymer material.

11. The method of claim 1, wherein providing a block copolymer material between first and second condensed phase surfaces comprises ordering the block copolymer material in the presence of the chemical pattern of the first condensed phase surface and a free surface to form a first structure.

12. The method of claim 11, further comprising placing the second condensed phase surface on the block copolymer material after forming the first structure.

13. The method of claim 12, further comprising ordering the block copolymer material in the presence of the second condensed phase surface.

14. The method of claim 1, wherein the block copolymer material comprises a block copolymer that has an interaction parameter $\chi$ greater than that of polystyrene-block-poly(methyl methacrylate) (PS-b-PMMA) at the temperature of assembly.

15. The method of claim 1, wherein the chemical pattern has a 1:1 correspondence to the corresponding block copolymer domains.

16. The method of claim 1, wherein the correspondence between the chemical pattern and the corresponding block copolymer domains is less than 1:1 such that the chemical pattern is less dense than the block copolymer domains.

17. The method of claim 1, further comprising conformally depositing the second condensed phase surface on the block copolymer material.

18. The method of claim 1, wherein ordering the block copolymer material comprises annealing the block copolymer material above the glass transition temperature of the component blocks of the block copolymer material.

19. The method of claim 1, wherein the blocks of the block copolymer material have different surface energies.

* * * * *